United States Patent
Schranz

(10) Patent No.: US 7,521,719 B2
(45) Date of Patent: Apr. 21, 2009

(54) LIGHT EMITTING AND IMAGE SENSING DEVICE AND APPARATUS

(76) Inventor: Paul Steven Schranz, Box G-30 RR1, 1270 Oceanview Road, Bowen Island, British Columbia (CA) V0N 1G0

(*) Notice: Subject to any disclaimer, the term of this patent is extended or adjusted under 35 U.S.C. 154(b) by 0 days.

(21) Appl. No.: 11/775,224

(22) Filed: Jul. 9, 2007

(65) Prior Publication Data

US 2008/0012029 A1    Jan. 17, 2008

Related U.S. Application Data

(63) Continuation-in-part of application No. 10/917,377, filed on Aug. 13, 2004, now Pat. No. 7,242,027.

(51) Int. Cl.
*H01L 33/00* (2006.01)
(52) U.S. Cl. .................. 257/80; 257/225; 257/E33.076
(58) Field of Classification Search .................... 257/80, 257/225, E33.076
See application file for complete search history.

(56) References Cited

U.S. PATENT DOCUMENTS

| | | | | |
|---|---|---|---|---|
| 5,371,384 A | * | 12/1994 | Wada | 257/82 |
| 5,493,577 A | * | 2/1996 | Choquette et al. | 372/46.013 |
| 5,629,534 A | * | 5/1997 | Inuzuka et al. | 257/84 |
| 5,965,875 A | * | 10/1999 | Merrill | 250/226 |
| 6,122,042 A | * | 9/2000 | Wunderman et al. | 356/73 |
| 6,151,015 A | | 11/2000 | Badyal et al. | |
| 6,281,882 B1 | | 8/2001 | Gordon et al. | |
| 6,339,248 B1 | * | 1/2002 | Zhao et al. | 257/461 |
| 6,433,780 B1 | | 8/2002 | Gordon et al. | |
| 6,541,762 B2 | | 4/2003 | Kang et al. | |
| 6,585,158 B2 | | 7/2003 | Norskog | |
| 6,590,917 B2 | * | 7/2003 | Nakayama et al. | 372/45.01 |
| 6,621,483 B2 | | 9/2003 | Wallace et al. | |
| 6,649,899 B2 | | 11/2003 | Misek | |
| 6,657,184 B2 | | 12/2003 | Anderson et al. | |
| 6,710,376 B2 | * | 3/2004 | Worley | 257/92 |
| 6,717,560 B2 | * | 4/2004 | Cok et al. | 345/82 |
| 6,770,863 B2 | | 8/2004 | Walley | |
| 6,774,351 B2 | | 8/2004 | Black | |
| 6,795,056 B2 | | 9/2004 | Norskog et al. | |
| 6,795,120 B2 | | 9/2004 | Takagi et al. | |
| 6,797,937 B2 | | 9/2004 | Norskog et al. | |
| 6,809,723 B2 | | 10/2004 | Davis | |
| 6,950,094 B2 | | 9/2005 | Gordon et al. | |
| 6,967,321 B2 | | 11/2005 | Leong et al. | |
| 6,974,947 B2 | | 12/2005 | Black et al. | |
| 6,977,645 B2 | | 12/2005 | Brosnan | |
| 6,995,748 B2 | | 2/2006 | Gordon et al. | |
| 7,045,775 B2 | | 5/2006 | Leong et al. | |
| 7,095,621 B2 | | 8/2006 | Saimun et al. | |
| 7,116,427 B2 | | 10/2006 | Baney et al. | |
| 7,146,106 B2 | | 12/2006 | Yang et al. | |
| 7,148,078 B2 | | 12/2006 | Moyer et al. | |
| 7,158,659 B2 | | 1/2007 | Baharav et al. | |
| 7,161,682 B2 | | 1/2007 | Xie et al. | |
| 7,164,782 B2 | | 1/2007 | Baharav et al. | |
| 7,176,442 B2 | | 2/2007 | Feldmeier et al. | |

(Continued)

*Primary Examiner*—Victor A Mandala

(57) ABSTRACT a photosensor structure; and switching means coupled between the photosensor structure and one of the plurality of signal lines, the switching means responsive to select signals on one or more of the plurality of select lines for conveying a photosensor signal between the photosensor structure and the one of the plurality of signal lines.

20 Claims, 22 Drawing Sheets

U.S. PATENT DOCUMENTS

| | | |
|---|---|---|
| 7,184,026 B2 | 2/2007 | Gordon et al. |
| 7,199,783 B2 | 4/2007 | Wenstrand et al. |
| 7,199,791 B2 | 4/2007 | Sun |
| 7,220,956 B2 | 5/2007 | Feldmeier et al. |
| 7,238,932 B2 | 7/2007 | Chee |
| 7,263,242 B2 | 8/2007 | Kakarala et al. |
| 7,274,808 B2 | 9/2007 | Baharav et al. |
| 7,292,225 B2 | 11/2007 | Gordon et al. |
| 7,295,186 B2 | 11/2007 | Brosnan |
| 7,310,086 B2 | 12/2007 | Tai et al. |
| 7,313,255 B2 | 12/2007 | Machida et al. |
| 7,317,447 B2 | 1/2008 | Tan et al. |
| 7,321,359 B2 | 1/2008 | Xie et al. |
| 7,335,922 B2 * | 2/2008 | Plaine et al. .................. 257/80 |
| 7,339,575 B2 | 3/2008 | Tai et al. |
| 7,358,958 B2 | 4/2008 | Welch et al. |
| 7,382,935 B2 | 6/2008 | Liew et al. |
| 7,420,542 B2 | 9/2008 | Butterworth et al. |
| 7,425,862 B2 | 9/2008 | Thelen et al. |
| 7,429,976 B2 | 9/2008 | Harley et al. |
| 7,446,756 B2 | 11/2008 | Brosnan et al. |
| 2003/0142075 A1 | 7/2003 | Chin |
| 2007/0108484 A1 * | 5/2007 | Nagamune et al. .......... 257/290 |

* cited by examiner

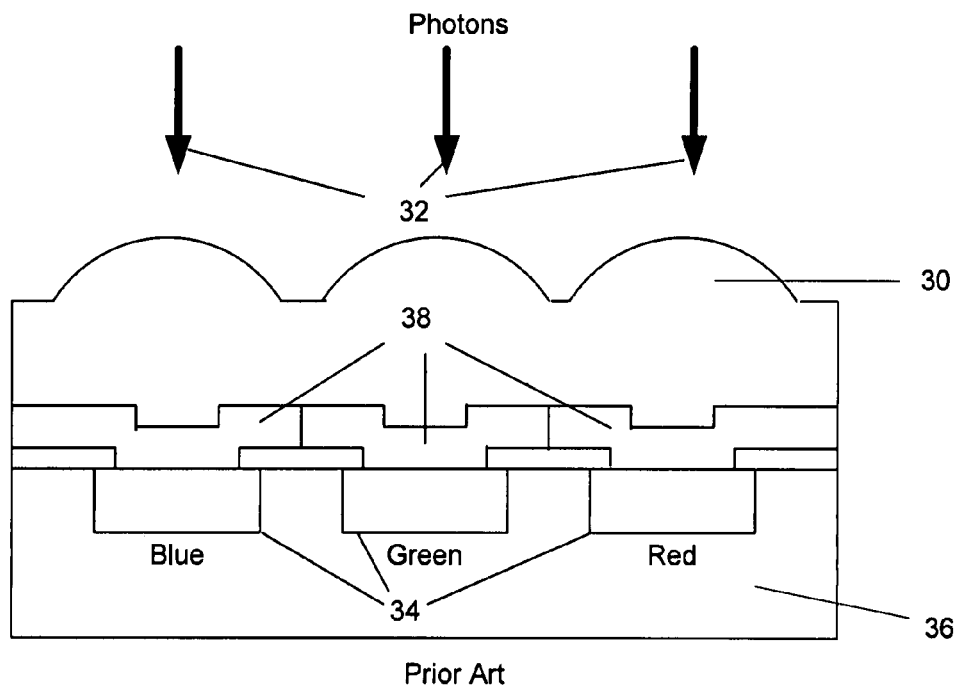
Figure 1
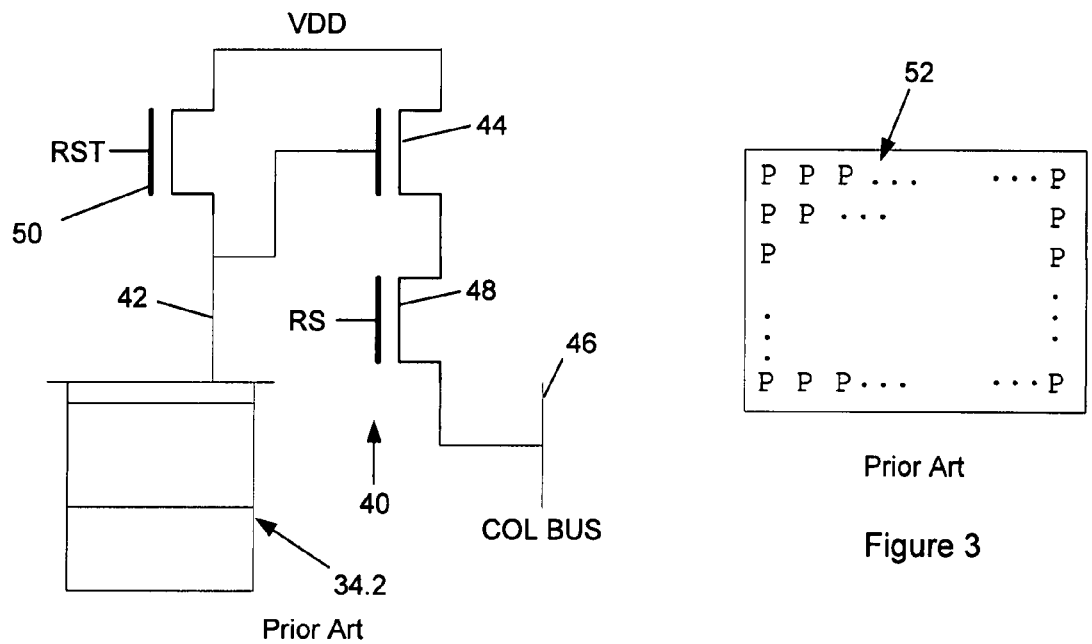
Figure 2
Figure 3

LIGHT EMITTING AND IMAGE SENSING DEVICE AND APPARATUS

RELATED APPLICATION

This application is a continuation-in-part application of U.S. Pat. application Ser. No. 10/917,377, filed Aug. 13, 2004 now U.S. Pat. No. 7,242,027 having first named inventor Paul Steven Schranz, and claims the priority benefit thereof.

BACKGROUND OF THE INVENTION

1. Field of the Invention

The present invention relates to a novel image sensor device, herein referred to as a light emitting and image sensing device, and the apparatus in which it is used.

2. Description of the Related Art

An embodiment of a conventional image sensor, in this case a CMOS image sensor, is schematically illustrated in cross-section in FIG. 1. A microlens 30 focuses incident light, or photons 32, on a plurality of photodiodes 34 in a silicon substrate 36. Color filters 38 filter photons of specific wavelengths so that each of the photodiodes 34 collects photons within one of three ranges of wavelengths, corresponding to red, green and blue light.

An embodiment of a conventional active pixel element in a CMOS image sensor is illustrated in schematic view in FIG. 2. The active pixel element comprises a photodiode and an active pixel circuit indicated generally by reference numerals 34.2 and 40 respectively. The photodiode 34.2 provides a photosensor signal on conductor 42. The photosensor signal on conductor 42 is read out through a buffer transistor 44 onto a column bus 46 when a row select transistor 48 is activated. A reset transistor 50 operates to reset the photodiode 34.2 to a known state.

A schematic plan view of the conventional image sensor is illustrated in FIG. 3. The conventional image sensor comprises a matrix of rows and columns of pixel elements indicated generally by reference numeral 52. Each of the pixel elements contains a photosensing structure and corresponding support circuitry, such as the photodiode 34.2 and active pixel circuit 40, respectively, illustrated in FIG. 2.

There are many image sensor applications wherein a light source is required to illuminate a scene, or an object, so that the image sensor can capture one or more images. Examples of such applications include but are not limited to video surveillance, cell phones, digital cameras and digital video systems. During low ambient light level conditions the light source is necessary for an image to be captured at all.

An example of a conventional infrared video surveillance camera is given by U.S. Pat. No. 6,642,955 by Brent Midgley et al. Midgley describes a CCD type image sensor in a camera system that switches electronically between infrared radiation sensing and visible light sensing depending on ambient conditions. Furthermore, the camera in Midgley makes use of either incandescent or LED type illuminators. These illuminators are located external to the camera system, but may be in a camera system enclosure along with the CCD image sensor.

An example of a CMOS sensor used in cell phone is given by U.S. Pat. No. 6,730,900 by Hsish et al. in which is described a novel CMOS based active sensor array that, along with focusing optics, is preferably incorporated into a cellular phone camera for producing electronic images.

A disadvantage of the prior art is the lack of integration of a light source for image illumination with the image sensor. This has resulted in excessively large image sensor products for the applications listed above. In the case of the video surveillance camera, the illuminator is either in a separate enclosure altogether, or is mounted inside the camera system enclosure thereby increasing the size.

Another disadvantage of the lack of integration is the inability to take advantage of an illumination apparatus. In a cell phone, for example, where space is a constrained, it is often not feasible to include the illumination apparatus. In this situation, a cell phone camera can only be used in conditions where ambient light is sufficient for its operation.

Furthermore, another disadvantage of the prior art is that by lack of integration the power consumption of the above mentioned products and applications is excessively large.

BRIEF SUMMARY OF INVENTION

In one aspect of the present invention there is provided a light emitting and image sensing device for a scene. The device is formed in a semiconductor substrate and comprises a photosensor component for sensing an image of the scene. The photosensor component is responsive to incident light from the scene and provides an electrical signal representative of the image. There is also a photoemitter component for emitting a light signal representative of the electrical signal, and a coupling component connecting the photosensor component with the photoemitter component.

In another aspect of the present invention there is provided a light emitting and image sensing device for a scene. The light emitting and image sensing device is formed in a semiconductor substrate and comprises a photoemitter means for illuminating the scene with light, and a photosensor means for sensing an image of the scene. The photosensor means is responsive to incident light from the scene.

In another aspect of the invention there is provided a light emitting and image sensing device that includes a photosensor means. The photosensor means comprises a matrix of rows and columns of photosensor structures responsive to incident light upon the light emitting and image sensing device. For each row in the matrix there is row select circuitry connected to each of the photosensor structures in the row for selectively designating for outputting output signals representative of the light sensed by the photosensor structure. For each column in the matrix there is column select circuitry connected to each of the photosensor structures in the column for selectively designating for outputting output signals representative of the light sensed by the photosensor structures.

In another aspect of the invention there is provided a light emitting and image sensing device having a photoemitter means. The photoemitter means includes an array of photoemitter structures operable to emit light from the device and a photoemitter control means for controlling an emission of the light from the array of photoemitter structures.

In another aspect of the invention there is provided a light emitting and image sensing device having a photosensor means. The photosensor means comprises a plurality of select lines, a plurality of signal lines, and a plurality of pixel elements. The pixel elements include a photosensor structure, and a switching means coupled between the photosensor structure and one of the plurality of signal lines. The switching means is responsive to select signals on one or more of the plurality of select lines for conveying a photosensor signal between the photosensor structure and the one of the plurality of signal lines.

In another aspect of the present invention there is provided a light emitting and image sensing device for a scene. The light emitting and image sensing device includes a photosensor means for sensing an image of the scene and a photoemitter means for illuminating the scene with light. The photosensor means is formed in a first semiconductor substrate and is responsive to incident light from the scene. The photoemitter means is formed in a second semiconductor substrate. The second semiconductor substrate is attached to the first semiconductor substrate.

In another aspect of the present invention there is provided a light emitting and image sensing device for a scene. The light emitting and image sensing device includes a photosensor means for sensing an image of the scene and a photoemitter means for illuminating the scene with light. The photosensor means is formed in a first semiconductor substrate and is responsive to incident light from the scene. The photoemitter means is formed in a second semiconductor substrate. The second semiconductor substrate is attached to the first semiconductor substrate. The light emitting and image sensing device further includes a photoemitter control circuit operable to control an emission of the light from the photoemitter means. The photoemitter control circuit is formed in the first semiconductor substrate.

In another aspect of the present invention there is provided a light emitting and image sensing device for a scene. The light emitting and image sensing device includes a photosensor means for sensing an image of the scene and a photoemitter means for illuminating the scene with light. The photosensor means is formed in a first semiconductor substrate and is responsive to incident light from the scene. The photoemitter means is formed in a second semiconductor substrate. The second semiconductor substrate is attached to the first semiconductor substrate. The photosensor means includes a matrix of rows and columns of photosensor structures responsive to incident light upon the device. For each row in the matrix there is row select circuitry connected to each of the photosensor structures in the row for selectively designating for outputting output signals representative of the light sensed by said photosensor structure. For each column in the matrix there is column select circuitry connected to each of the photosensor structures in said column for selectively designating for outputting output signals representative of the light sensed by said photosensor structures.

In another aspect of the invention there is provided a light emitting and image sensing device that is formed in a semiconductor substrate. The light emitting and image sensing device comprises a photoemitter operable to emit electromagnetic radiation from the device, and a photosensor responsive to electromagnetic radiation incident upon the device.

In another aspect of the invention there is provided a lens housing for an image sensor type camera, the camera for generating an image of a scene. The lens housing comprises a first light channel for guiding an emission of light from the image sensor to illuminate the scene, and a second light channel for guiding light from the scene towards the image sensor.

In another aspect of the invention there is provided a housing for a light emitting and image sensing device. The housing comprises a first light channel for emitted light from the light emitting and image sensing device to illuminate a scene, and a second light channel for incident light from the scene towards the light emitting and image sensing device.

In another aspect of the invention there is provided a housing for a light emitting and image sensing device. The housing comprises a first light channel for emitted light from the light emitting and image sensing device to illuminate a scene, and a second light channel for incident light from the scene towards the light emitting and image sensing device. The second light channel has an outer surface. The first and second light channels have a common axis. The first light channel being formed around the outer surface of the second light channel.

In another aspect of the invention there is provided, in combination, a light emitting and image sensing device and a housing. The housing has a first end where the light emitting and image sensing device is disposed.

In another aspect of the invention there is provided a method of illuminating a scene and sensing an image. The method comprises the steps of emitting light from a light emitting and image sensing device, channelling the emitted light along a first channel, dispersing the light with a first lens towards the scene, focusing incident light from the scene with a second lens, channelling the focused light along a second channel towards the light emitting and image sensing device, and sensing the image of the scene with the focused light upon the light emitting and image sensing device.

BRIEF DESCRIPTION OF DRAWINGS

The invention will be more readily understood from the following description of preferred embodiments thereof given, by way of example only, with reference to the accompanying drawings, in which:

FIG. 1 is a schematic view in cross-section of a conventional CMOS image sensor;

FIG. 2 is a schematic view of a conventional active pixel element;

FIG. 3 is a schematic plan view of a conventional image sensor;

DESCRIPTION OF THE PREFERRED EMBODIMENTS

Figure 4A:
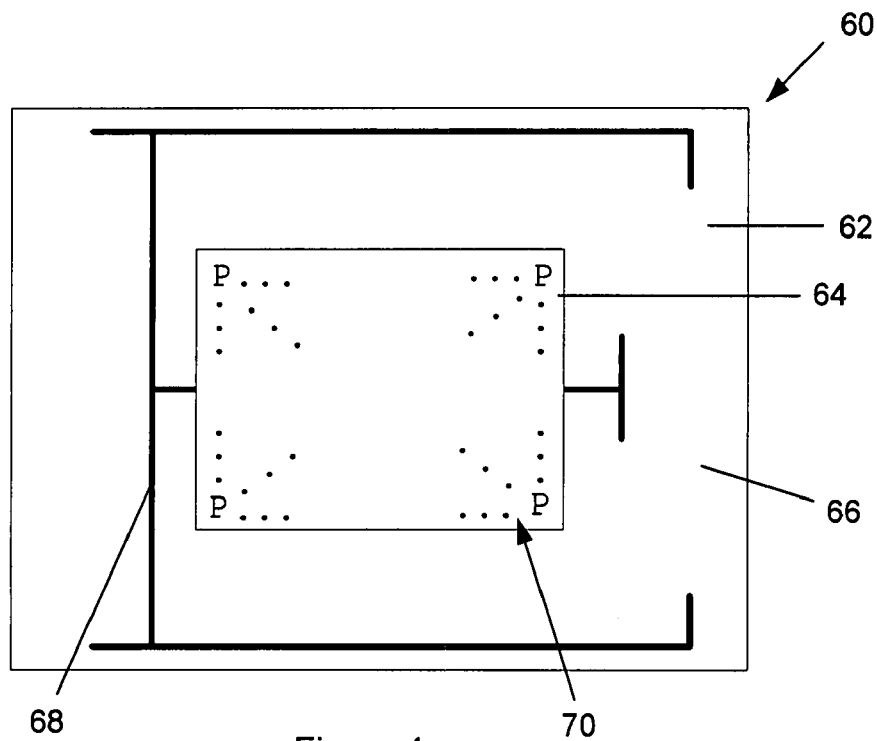
FIGS. 4a-h are schematic plan views of embodiments of light emitting and image sensing devices.

Referring to FIG. 4a, a light emitting and image sensing device, indicated generally by reference numeral 60, is formed in a semiconductor and has a light emitting region 62 and an image sensing region 64. The light emitting region 62 has a photoemitter 68. The photoemitter 68 operates to emit light, from a surface 66, to illuminate a scene, or an object. The emitted light is in a range of wavelengths, which can be in an infrared band, a visible light band or an ultraviolet band of the electromagnetic spectrum. Other bands of the electrical magnetic spectrum are, however, possible as well.

The image sensing region 64 has a plurality of pixel elements indicated generally by reference numeral 70. The pixel elements 70 are responsive to incident light from the scene, or the object. Each of the pixel elements 70 provides a photosensor signal representative of the incident light in the area of the respective pixel element. The plurality of pixel elements 70 can be arranged in a matrix having rows and columns. An image sensor resolution is determined by a first number of pixel elements in each row and by a second number of pixel elements in each column.

Figure 4B:
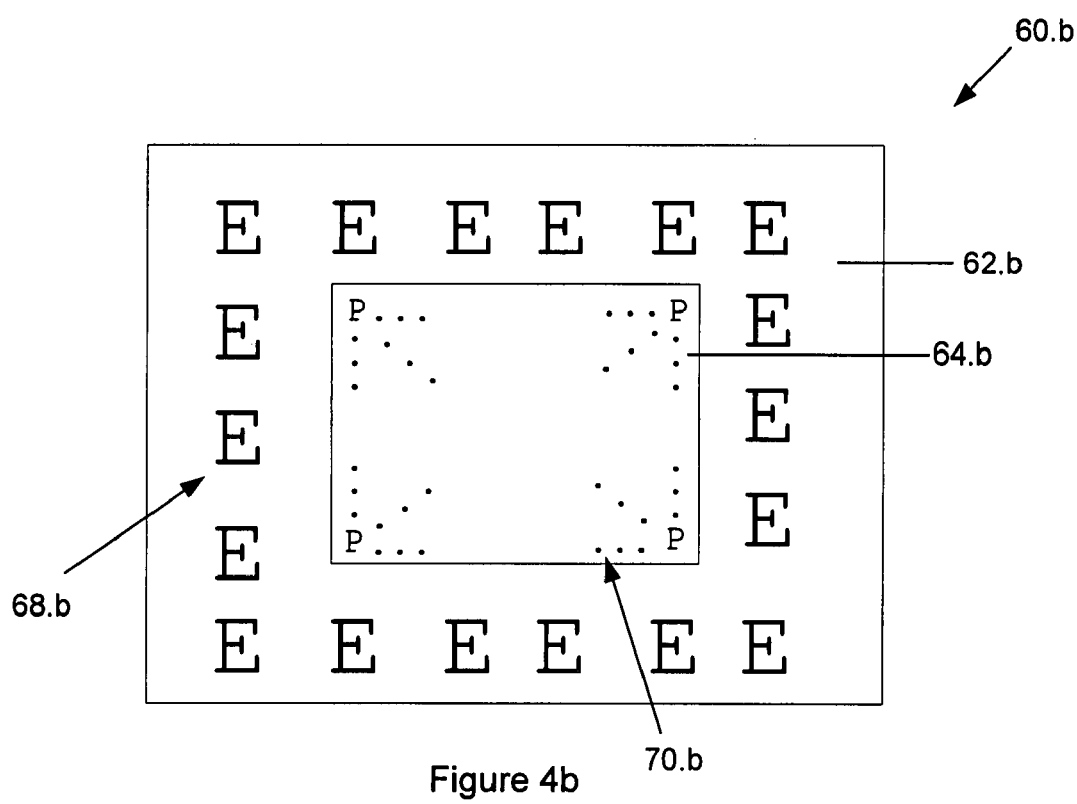
Figure 4C:
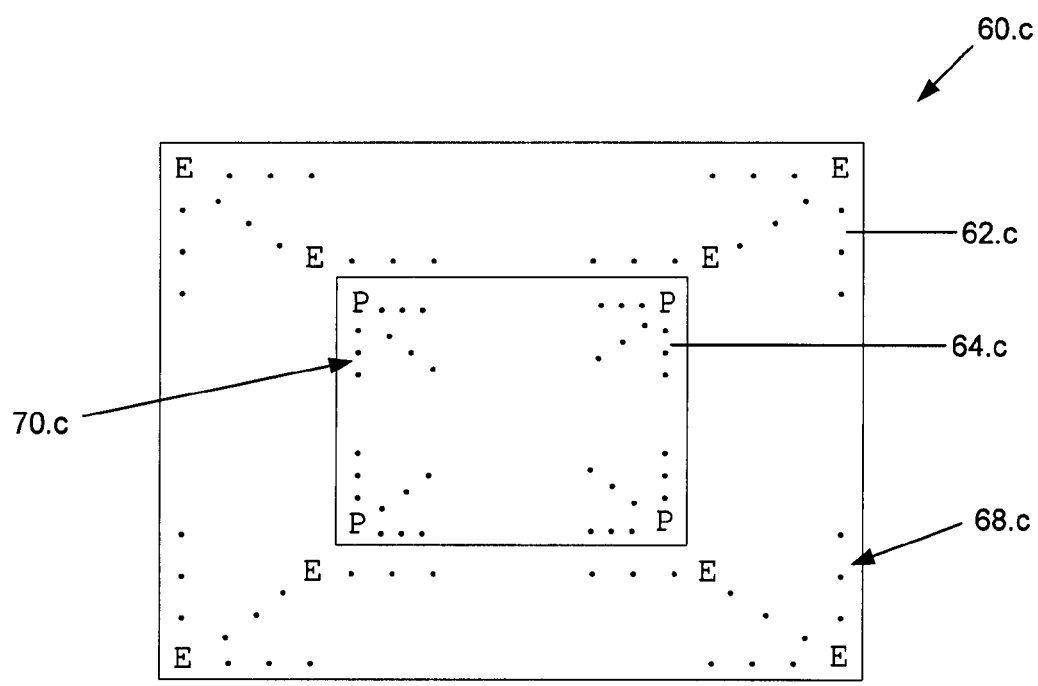

Two further embodiments of the invention similar to the embodiment shown in FIG. 4a are illustrated in FIGS. 4b and 4c wherein like parts have like reference numerals with an additional suffix. The embodiment illustrated in FIG. 4b includes a plurality of photoemitters 68.b positioned in a photoemitter region 62.b around an image sensing region 64.b. The embodiment illustrated in FIG. 4c includes a plurality of photoemitters 68.c having a photoemitter density comparable to a pixel element density.

Figure 4D:
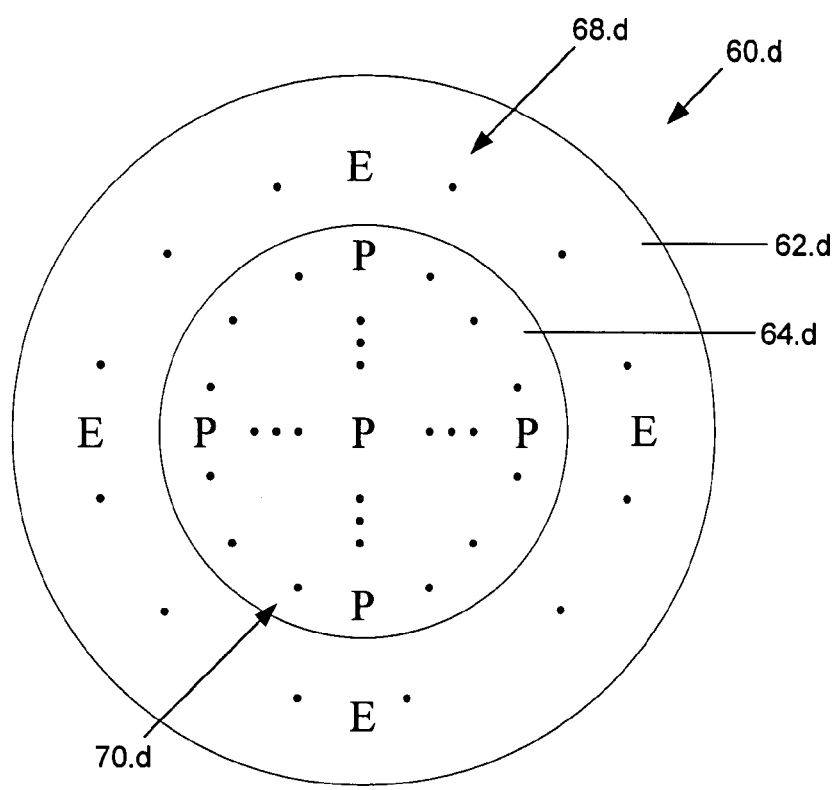

Another embodiment of the invention is illustrated in FIG. 4d wherein like parts have like reference numerals with an additional suffix. The light emitting and image sensing device 60.d has a circular image sensing region 64.d surrounded by a ring-shaped light emitting region 62.d. The light emitting region 62.d has a plurality of photoemitters 68.d. The image sensing region 64.d has a plurality of pixel elements 70.d.

Figure 4E:
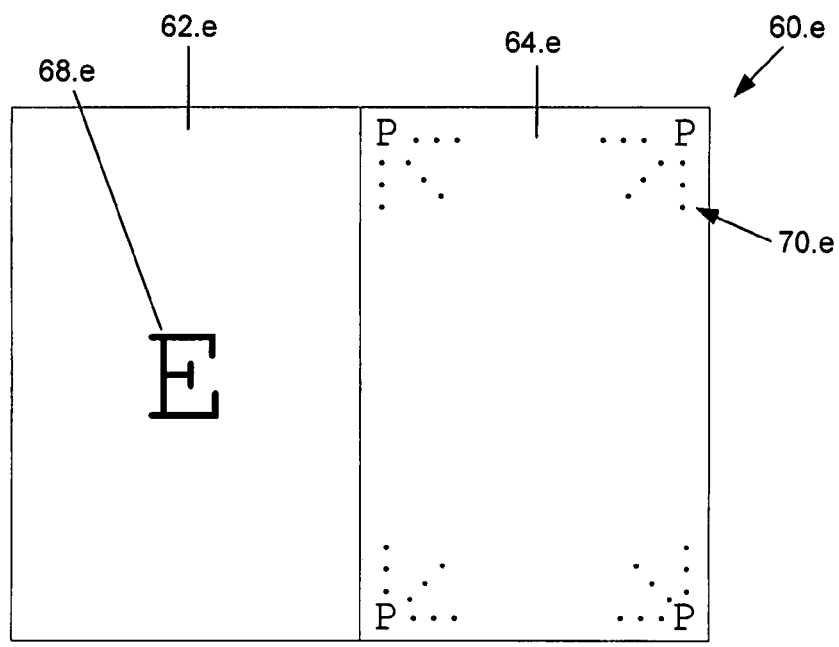
Figure 4F:
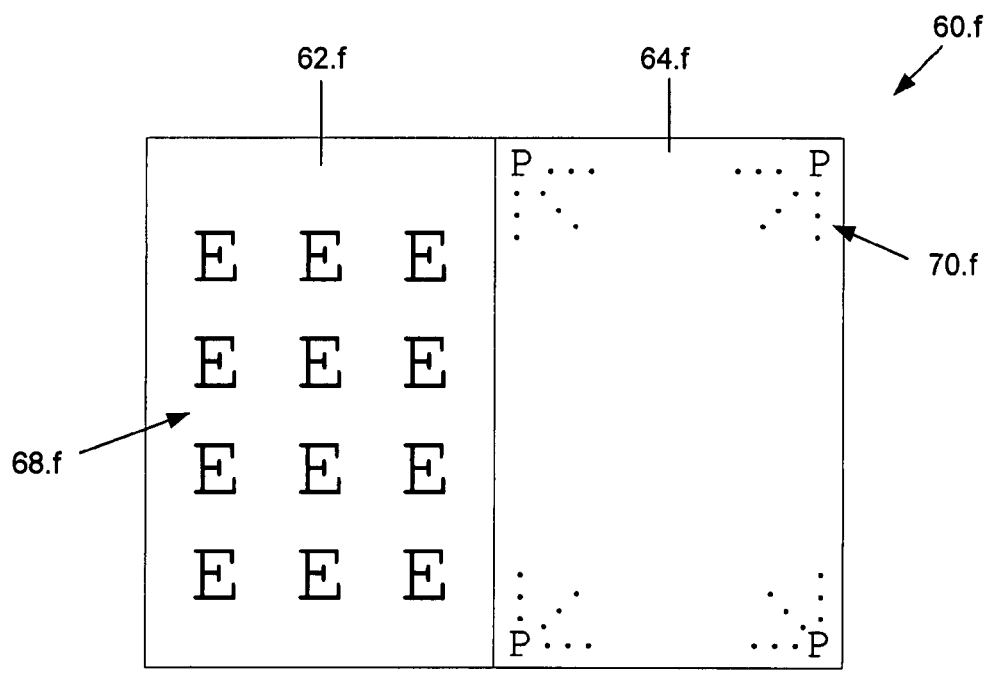
Figure 4G:
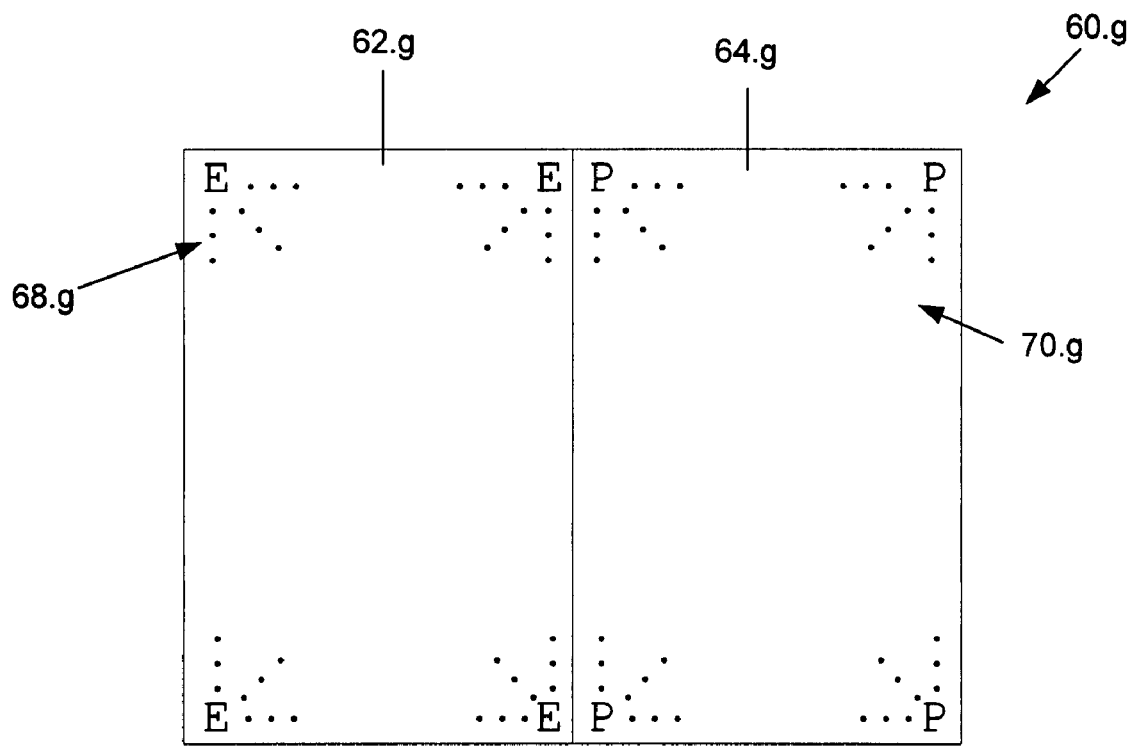

Three further embodiments of the invention are illustrated in FIGS. 4e, 4f and 4g wherein like parts have like reference numerals with an additional suffix. The embodiment illustrated in FIG. 4e includes a light emitting region 62.e adjacent an image sensing region 64.e. The light emitting region 62.e includes a photoemitter 68.e and the image sensing region 64.e includes a plurality of pixel elements 70.e. The plurality of pixel elements 70.e can be arranged in a matrix having rows and columns. The embodiments illustrated in FIGS. 4f and 4g are similar to that of FIG. 4e, both including a plurality of photoemitters 68.f and 68.g respectively. The plurality of photoemitters 68.g has a photoemitter density comparable to a pixel element density.

Figure 4H:
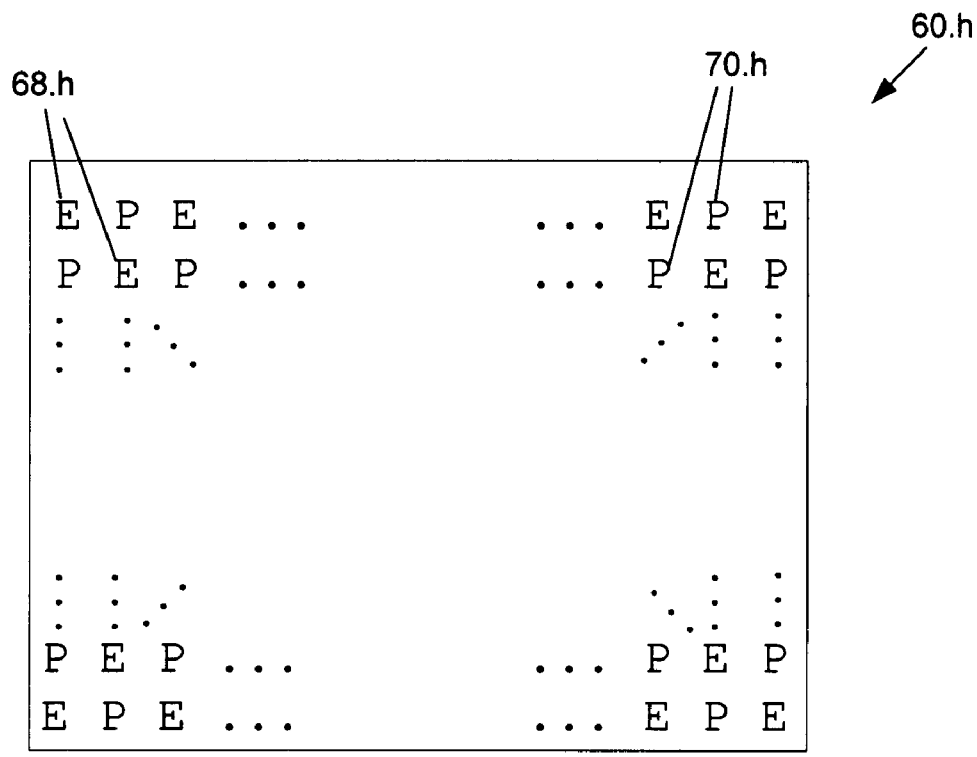

Another embodiment of the invention is illustrated in FIG. 4h wherein like parts have like reference numerals with an additional suffix. In this embodiment a plurality of photoemitters 68.h are arranged in an alternating pattern with a plurality of pixel elements 70.h. A photoemitter density can be different than a pixel element density.

Figure 5:
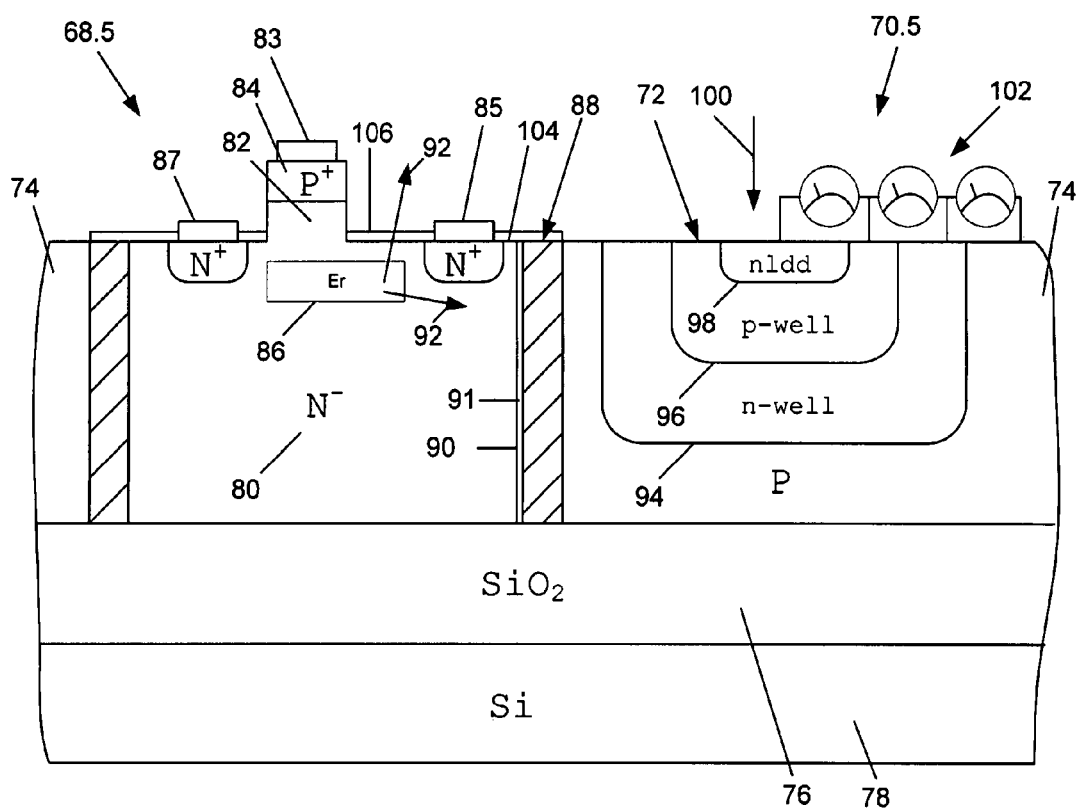
FIG. 5 is a schematic view in cross-section of an embodiment of the light emitting and image sensing device in a silicon substrate.

Another embodiment of the invention is illustrated in FIG. 5, wherein like parts have like reference numerals with an additional suffix. A photoemitter indicated generally by reference numeral 68.5 is separated from a pixel element indicated generally by reference numeral 70.5. The photoemitter 68.5 and the pixel element 70.5 are formed on and in a first layer of silicon 74. The first layer of silicon is formed on top of a silicon oxide ($SiO_2$) layer 76, which is formed on top of a silicon substrate 78.

In this embodiment the photoemitter 68.5 is similar to a semiconductor device for electro-optic applications described in European Patent EP1210752 by Coffa et al., which is incorporated by reference herein. An $N^-$ region 80, an N region 82 and a $P^+$ region 84 are formed in the silicon layer 74, and together make a PN junction that under reverse bias emits light 92. One skilled in the art will recognize that the PN junction is similar to a base-collector junction of a bipolar transistor having a base electrode 83, a collector electrode 85 and an emitter electrode 87. A rare earth ions doped region 86, in this case Erbium, enables the PN junction to emit light 92 having a wavelength around 1.54 um. Using other rare earth ions allows light to be emitted having different wavelengths. For instance, as a non-limiting example, Terbium and Ytterbium provide light having a wavelength around 540 nm and 980 nm respectively.

A trench, indicated generally by reference numeral 88, serves to reduce lateral light transmission from the rare earth ions doped region 86 towards the pixel element 70.5. The trench 88 has a wall 90 upon which there is a film of silicon oxide ($SiO_2$) 91. Light 92 travelling from the rare earth ions doped region 86 towards the pixel element 70.5 through the semiconductor layer 74 must cross the wall 90 and travel through the film of silicon oxide ($SiO_2$) 91. The refractive index of silicon oxide ($SiO_2$) is less than the refractive index of silicon. This causes light incident on the wall 90 having an angle of incidence, from a normal to the wall, greater than a critical angle to undergo total internal reflection. In other embodiments multiple trenches having films of silicon oxide ($SiO_2$) can be used to further reduce lateral light transmission. The trench 88 has the advantage of reducing phantom images in and preventing blurring of pixel element 70.5 as caused by the above mentioned lateral light transmission.

The light 92 emitted from the rare earth ions doped region 86 has random directions. The light 92 strikes a surface 104, defined by a boundary between the silicon layer 74 and a silicon oxide layer 106, at various angles of incidence to a normal to the surface. Light 92 having the angle of incidence greater then the critical angle will be internally reflected. It is advantageous, then, that the light 92 be substantially normal to the surface 104 in order for maximum light emission from the surface. The goal is to maximize an external quantum efficiency, a problem well known in the art. In another embodiment, a photoemitter can be provided similar to a device presented in "Si-based Resonant Cavity Light Emitting Devices" by Castagna et al in SPIE Vol 5366, which is incorporated by reference herein. This has the advantage that light generated is substantially normal to surface 104. This has a further advantage of reducing lateral light transmission through the semiconductor layer 74 towards the pixel element 70.5.

The pixel element 70.5 of the present embodiment is commonly known in the prior art, as disclosed by U.S. Pat. No. 5,965,875 by Merril, which is incorporated by reference herein, and as such will not be described in great detail here. The pixel element 70.5 includes a photosensor structure 72. The photosensor structure 72 is based on a triple well structure forming a first PN junction 94, a second PN junction 96 and a third PN junction 98. Incident light 100 having different wavelengths penetrates the photosensor structure 72 at varying depths depending on the wavelength. Red light penetrates to around the depth of the first PN junction 94 where it produces a red photo current. Green light penetrates to around the depth of the second PN junction 96 where it produces a green photo current. Blue light penetrates to around the depth of the third PN junction 96 where it produces a blue photo current. A photocurrent sensor indicated generally by reference numeral 102 measures the red, green and blue photocurrents.

When the incident light 100 is in the near ultraviolet and near infrared bands of the electromagnetic spectrum, the photosensor structure 72 is still capable of functioning well. A study performed by Alternate Vision Corporation indicates that the photosensor structure 72 performs well under such conditions. The results of the study were published in a paper titled "Infrared and ultraviolet imaging with a CMOS sensor having layered photodiodes" by Gilblom et al.

The pixel element 70.5 of this embodiment is advantageous since it takes less area of surface 104 to sense red, green and blue components of light 100. This allows increased resolution for a given surface area. Nevertheless, other image sensor structures formed in silicon can be used for the present invention. This includes CMOS image sensor structures, such as in FIG. 1, and CCD image sensor structures.

Figure 6:
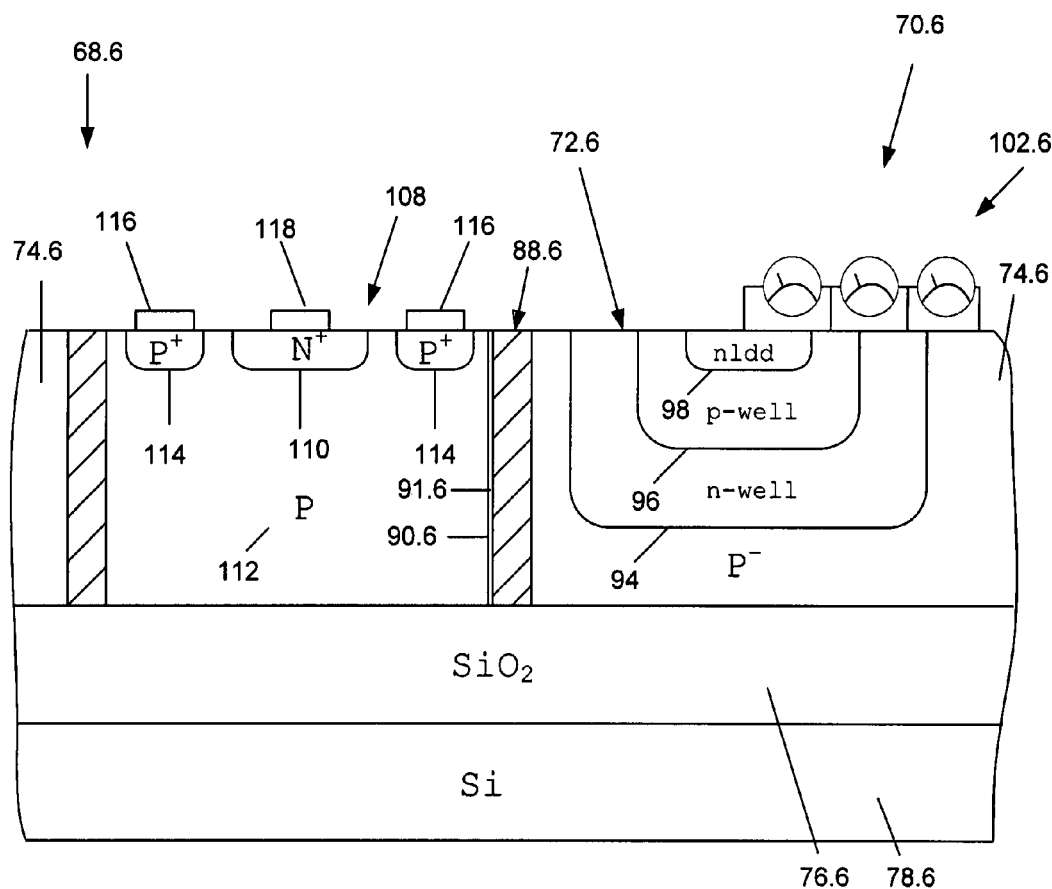
FIG. 6 is a schematic view in cross-section of another embodiment of the light emitting and image sensing device in a silicon substrate.

Referring now to FIG. 6, another embodiment of the invention is illustrated wherein like parts have like reference numerals with an additional suffix. The photoemitter 68.6 is in this case formed using a PN junction diode, indicated generally by reference numeral 108, with un-annealed implant dislocations used to enhance light emission. The structure of the PN junction diode 108 is described in great detail in U.S. Pat. No. 6,710,376 by Worley, which is incorporated by reference herein. The pixel element 70.6 is similar to the pixel element 70.5 in FIG. 5.

The PN junction 108 is comprised of an N+ implant region 110, in a doped P type region 112, and a P+ implant 114 that is used to make a good electrical connection between the P-type region and metal terminals 116. A connection is made to the N+ implant region 110 using the metal terminal 118.

Several light emitting devices are known in the prior art that use III-V or II-VI semiconductors and compound semiconductors, for example LEDs, resonant cavity light emitting diodes (RCLED) and vertical cavity surface emitting lasers (VCSEL). It would be advantageous to include these types of devices with a silicon based image sensor.

Figure 7:
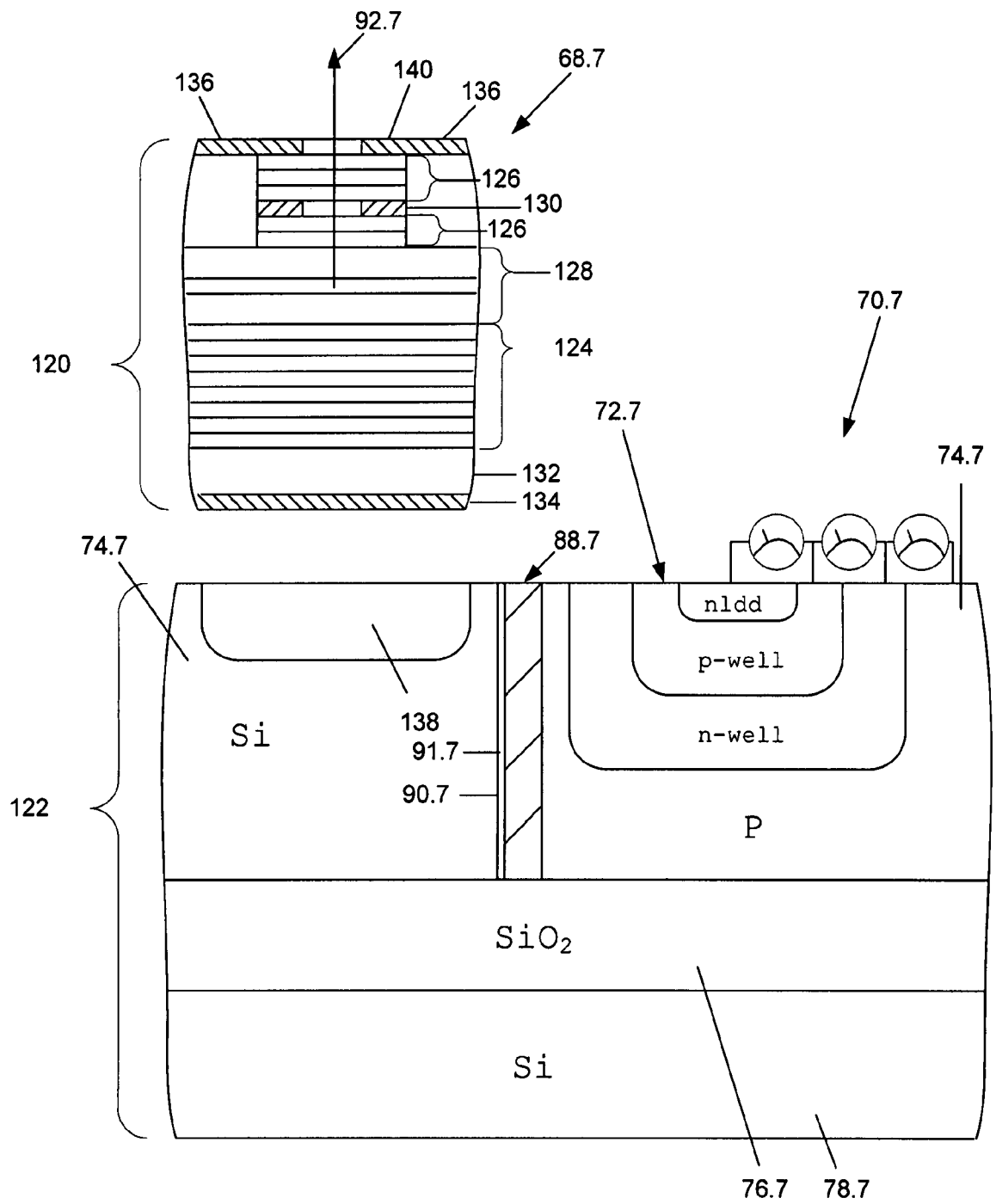
FIG. 7 is a broken-away schematic view in cross-section of an embodiment of the light emitting and image sensing device wherein a photoemitter is in a first semiconductor substrate and a pixel element is in a second semiconductor substrate.

Another embodiment of the invention is illustrated in FIG. 7 wherein like parts have like reference numerals with an additional suffix. A first semiconductor substrate 120 is illustrated above a second semiconductor substrate 122. The first semiconductor substrate 120 is formed from III-V or II-VI compound semiconductor materials, whereas the second semiconductor substrate 122 is formed from silicon. A photoemitter 68.7 is formed in the first semiconductor substrate 120, and a pixel element 70.7 is formed in the second semiconductor substrate 122. The pixel element 70.7 is similar to the pixel element 70.5 in FIG. 5.

In the present embodiment, the photoemitter 68.7 is similar to a light emitting device disclosed in U.S. Pat. 5,493,577 by Choquette et al, which is incorporated by reference herein, wherein the light emitting device has a structure compatible for both RCLEDs and VCSELs. The photoemitter 68.7 comprises a first distributed Bragg reflector (DBR) 124, a second DBR 126, an active region 128 and a control layer 130. The first and second DBRs 124 and 126 and the active region 128 form a resonator, or what is commonly called a Fabry-Perot resonator. A substrate 132 attaches the first DBR 124 to a first electrode 134. A second electrode 136 is deposited on the second DBR 126. Choquette describes the operation of the photoemitter 68.7 for RCLED and VCSEL embodiments in great detail.

Light 92.7 is emitted substantially along an axis and normal to a surface 140. Since the index of refraction of the second DBR 126 is greater than that of air, the surrounding environment, this has the advantage of minimizing the effects of internal reflection at the surface 140. This increases an external quantum efficiency of the photoemitter 68.7. Another advantage of the orientation of light 92.7 to surface 140 is that light is substantially not emitted towards the photosensor structure 72.7. This prevents the formation of phantom images in and/or blurring of the pixel element 70.7. In this embodiment the light 92.7 has a wavelength of 980 nm which is in the near infrared region.

The first semiconductor substrate 120 is attached to the second semiconductor substrate 122. The first electrode 134 is operatively connected to photoemitter control circuitry 138, which can enable, disable and control the intensity of light emission of the photoemitter 68.7. Attaching different types of semiconductor substrates together, for instance GaAs and Si, and providing many electrical connections between them is well known in the art. The company Xanoptix Inc. provides such hybrid integrated circuit technology.

Figure 8:
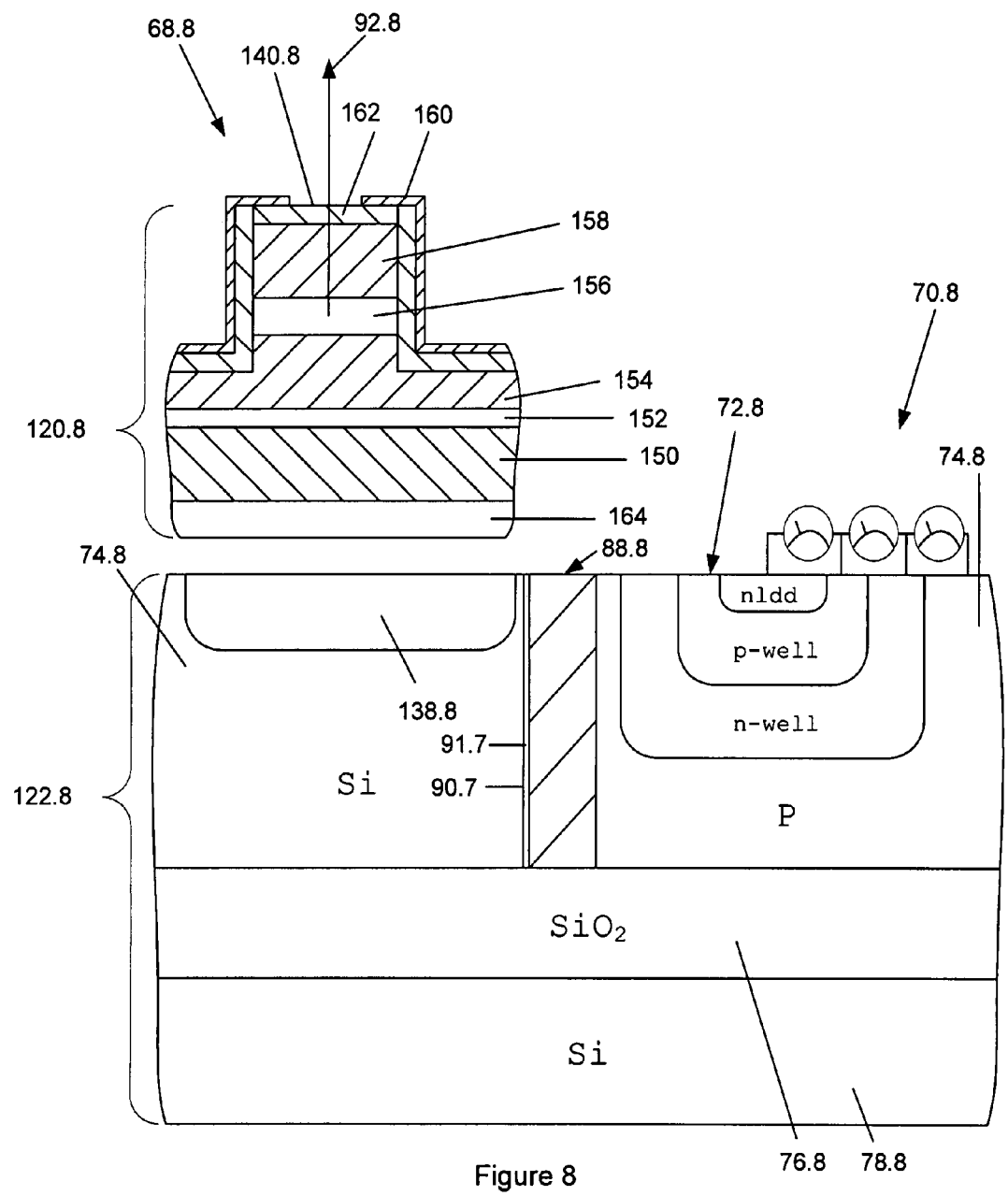
FIG. 8 is a schematic view in cross-section of another embodiment of the light emitting and image sensing device wherein a photoemitter is in a first semiconductor substrate and a pixel element is in a second semiconductor substrate.

In another embodiment, a light emitting and image sensing device using a III-V compound semiconductor substrate and a silicon substrate is illustrated in FIG. 8, wherein like parts have like reference numerals with an additional suffix. In this embodiment, the photoemitter 68.8, again, is formed in the first semiconductor substrate 120.8, and the pixel element 70.8 is formed in a second semiconductor substrate 122.8. The photoemitter 68.8 is similar in structure to a VCSEL disclosed in U.S. Pat. No. 6,590,917 by Nakayama et al., which is incorporated by reference herein. The photoemitter 68.8 includes an n-type GaAs substrate 150, an epitaxial n-type GaAs layer 152, an n-type DBR 154, an active layer region 156, a p-type DBR 158, a first mode control layer 160, a second mode control layer 162 and an electrode 164.

The photoemitter 68.8 is similar in structure to a VCSEL disclosed in U.S. Pat. No. 6,590,917 by Nakayama et al. The photoemitter 68.8 includes an n-type GaAs substrate 150, an epitaxial n-type GaAs layer 152, an n-type DBR 154, an active layer region 156, a p-type DBR 158, a first mode control layer 160, a second mode control layer 162 and an electrode 164.

Light 92.8, again, is emitted substantially normal to a surface 140.8 having the advantage of increasing an external quantum efficiency and minimizing light emitted towards the photosensor structure 72.8.

Figure 9:
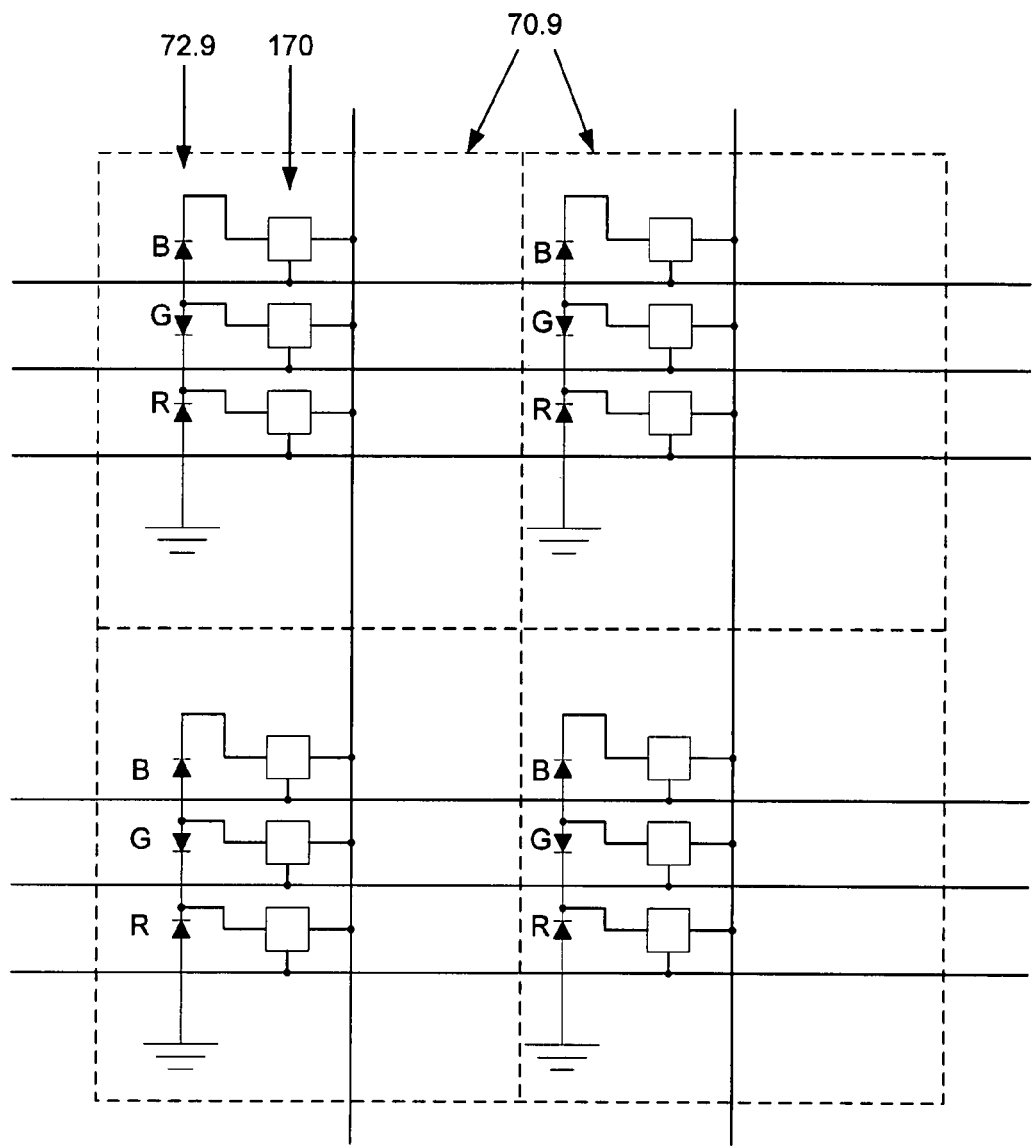
FIG. 9 is a partial schematic view of a matrix of active pixel elements of the light emitting and image sensing device of FIG. 5.
Figure 10:
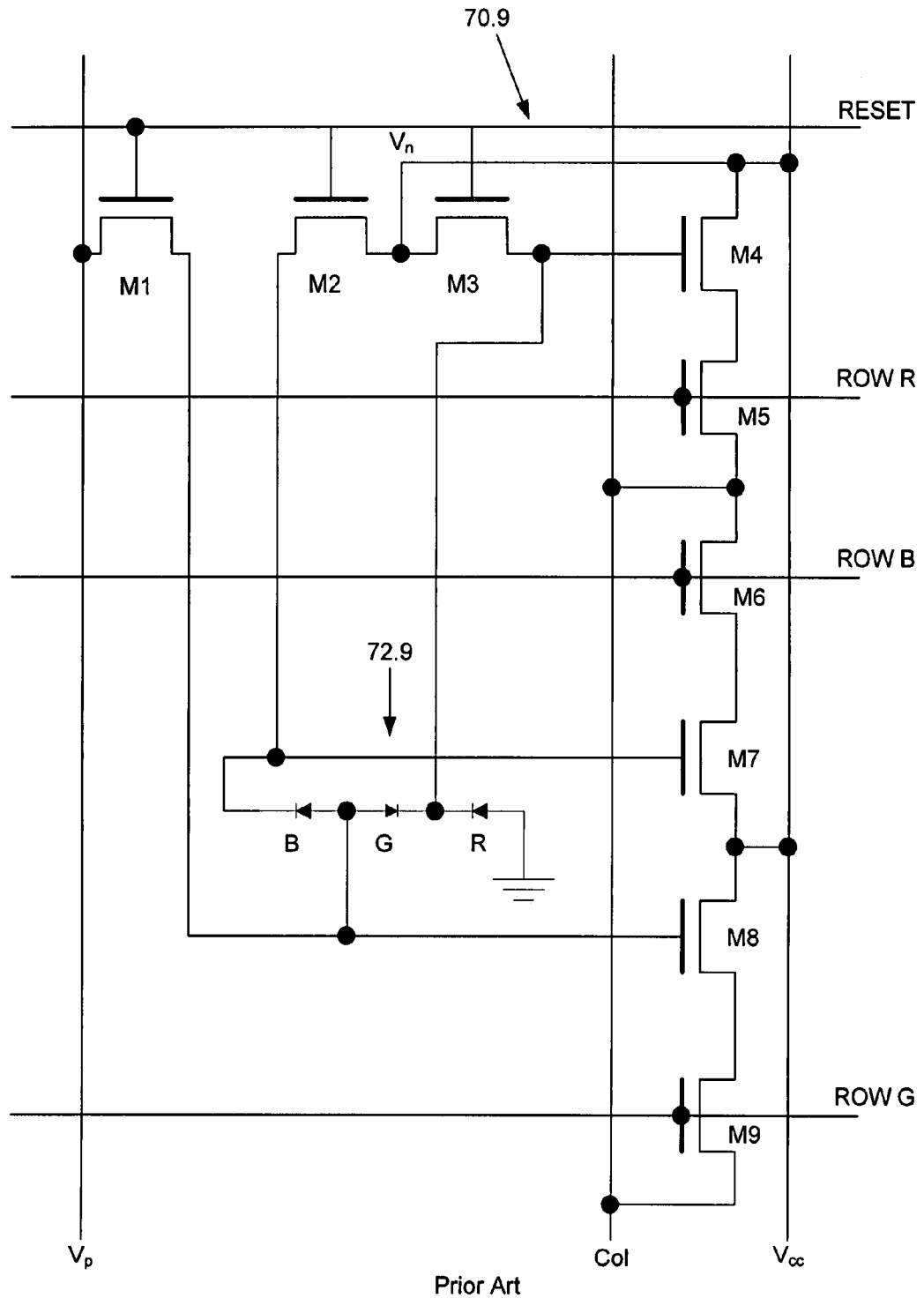
FIG. 10 is a schematic view of an active pixel element of the light emitting and image sensing device of FIG. 5.

Referring back to FIGS. 4a-h, the light emitting and image sensing devices 60 and 60b-h include the plurality of pixel elements 70 and 70b-h respectively. Each one of the pixel elements 70 and 70b-h can be the pixel element 70.5 illustrated FIG. 5. In another embodiment, the pixel element 70.5 illustrated in FIGS. 5, and similarly the pixel elements 70.6, 70.7 and 70.8 illustrated in FIGS. 6, 7, and 8 respectively, can be arranged in a matrix configuration as illustrated in FIG. 9, wherein like parts have like reference numerals with an additional suffix. Four such pixel elements 70.9 are illustrated in FIG. 9 in a matrix having two rows and two columns (2×2), however, there may be any number of rows and columns. Each pixel element 70.9 comprises a photosensor structure and an active pixel circuit indicated generally by reference numeral 72.9 and 170 respectively. The pixel element 70.9 is further illustrated in FIG. 10, wherein the active pixel circuit 170 is presented in greater detail. The operation of the pixel elements 70.9 is described in great detail in Merril.

Figure 11A:
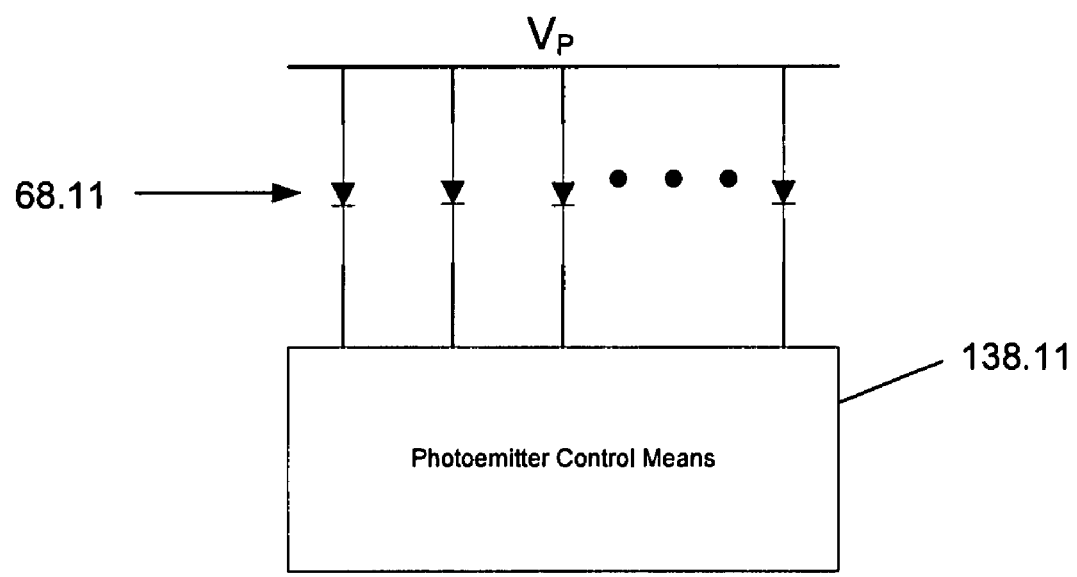
FIG. 11a-b are schematic views of embodiments of light emitting and image sensing devices wherein an array of photoemitters is connected to a photoemitter control means.
Figure 11B:
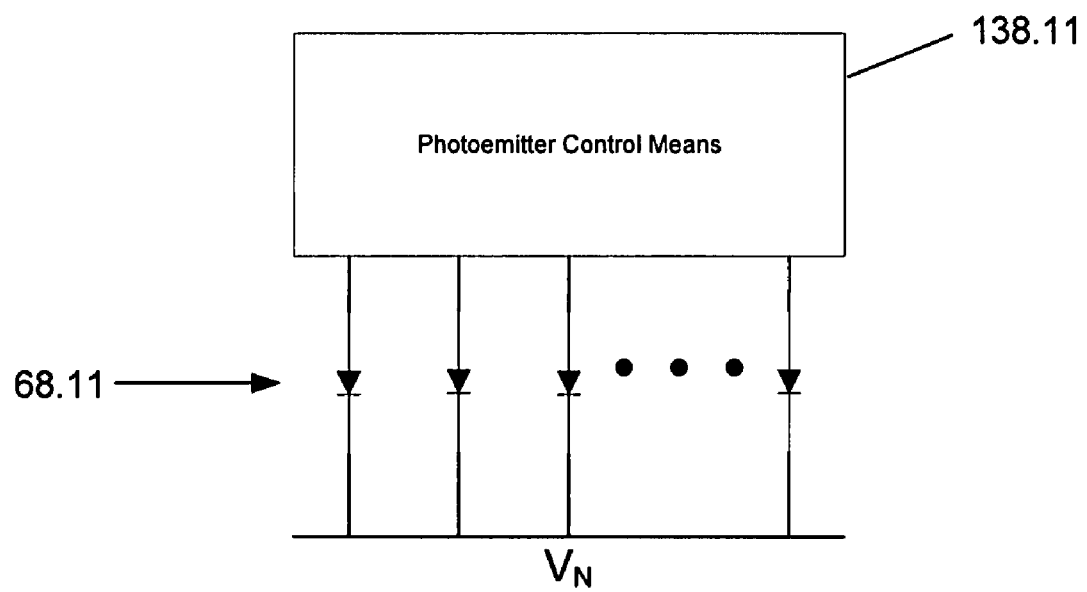

Again, referring back to FIGS. 4b-d and 4f-h, the light emitting and image sensing devices 60b-d and 60f-h include a plurality of photoemitters 68b-d and 68f-h respectively. In another embodiment, a plurality of photoemitters 68.11 in a light emitting and image sensing device is controlled by a photoemitter controller 138.11 as illustrated in FIGS. 11a-b, wherein like parts have like reference numerals with an additional suffix. The photoemitter controller 138.11 enables the photoemitters 68.11 to emit light, disables the emission of light and controls the intensity of emitted light. The photoemitter controller 138.11 can be an adjustable current source, for example, which is well known in the art. The light emitting and image sensing device includes the photoemitter controller 138.11. In other embodiments, the photoemitter control means 138.11 can be external of a light emitting and image sensing device. In this case, the photoemitters 68.11 are connected to the photoemitter controller 138.11 by an electrical connector for example a connecting pin, or pad.

Figure 12:
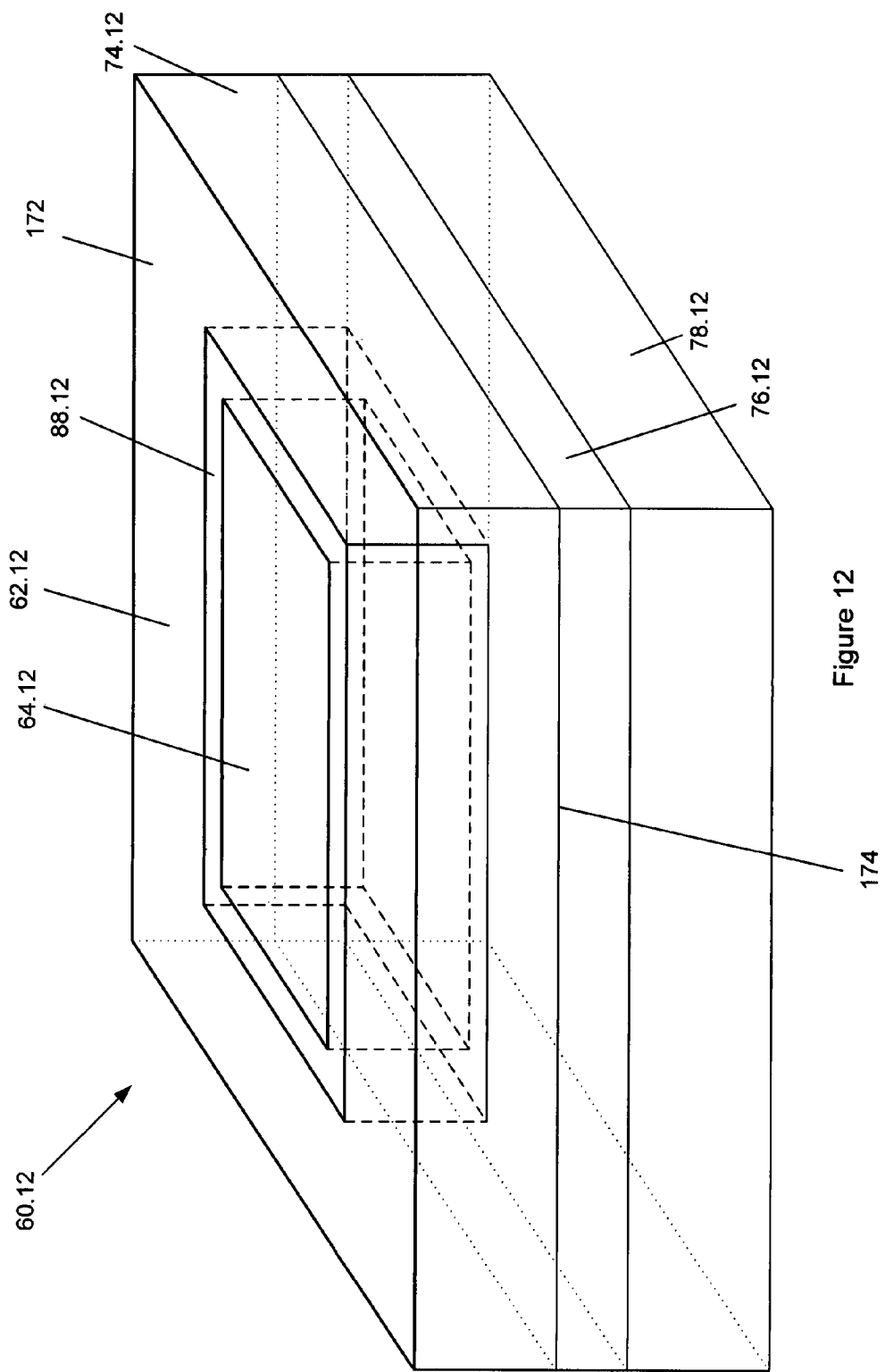
FIG. 12 is a schematic view in perspective of the light emitting and image sensing devices of the embodiments of FIGS. 4a-c.

Referring back to FIGS. 5, and similarly with FIGS. 6, 7 and 8, the trench 88 operates to reduce light transmission from the photoemitter 68.5 towards the pixel element 70.5. In another embodiment of the invention illustrated in FIG. 12, wherein like parts have like reference numerals with an additional suffix, a trench 88.12 separates two regions in a semiconductor layer 74.12, for instance a silicon layer. The trench 88.12 extends from a surface 172 to a boundary surface 174 between the semiconductor layer 74.12 and a layer 78.12, for instance a silicon oxide ($SiO_2$) layer. A light emitting region 62.12 and an image sensing region 64.12 correspond to the corresponding regions in the light emitting and image sensing devices 60, 60.b and 60.c of FIGS. 4a-c respectively. The trench 88.12 serves to substantially reduce light transmission from the light emitting region 62.12 through the semiconductor layer 74.12 towards the image sensing region 64.12. When the semiconductor layer 74.12 is silicon (or doped silicon) the trench 88.12 can have a wall, next to the light emitting region 62.12, which has a film of silicon oxide ($SiO_2$) thereon.

Figure 13:
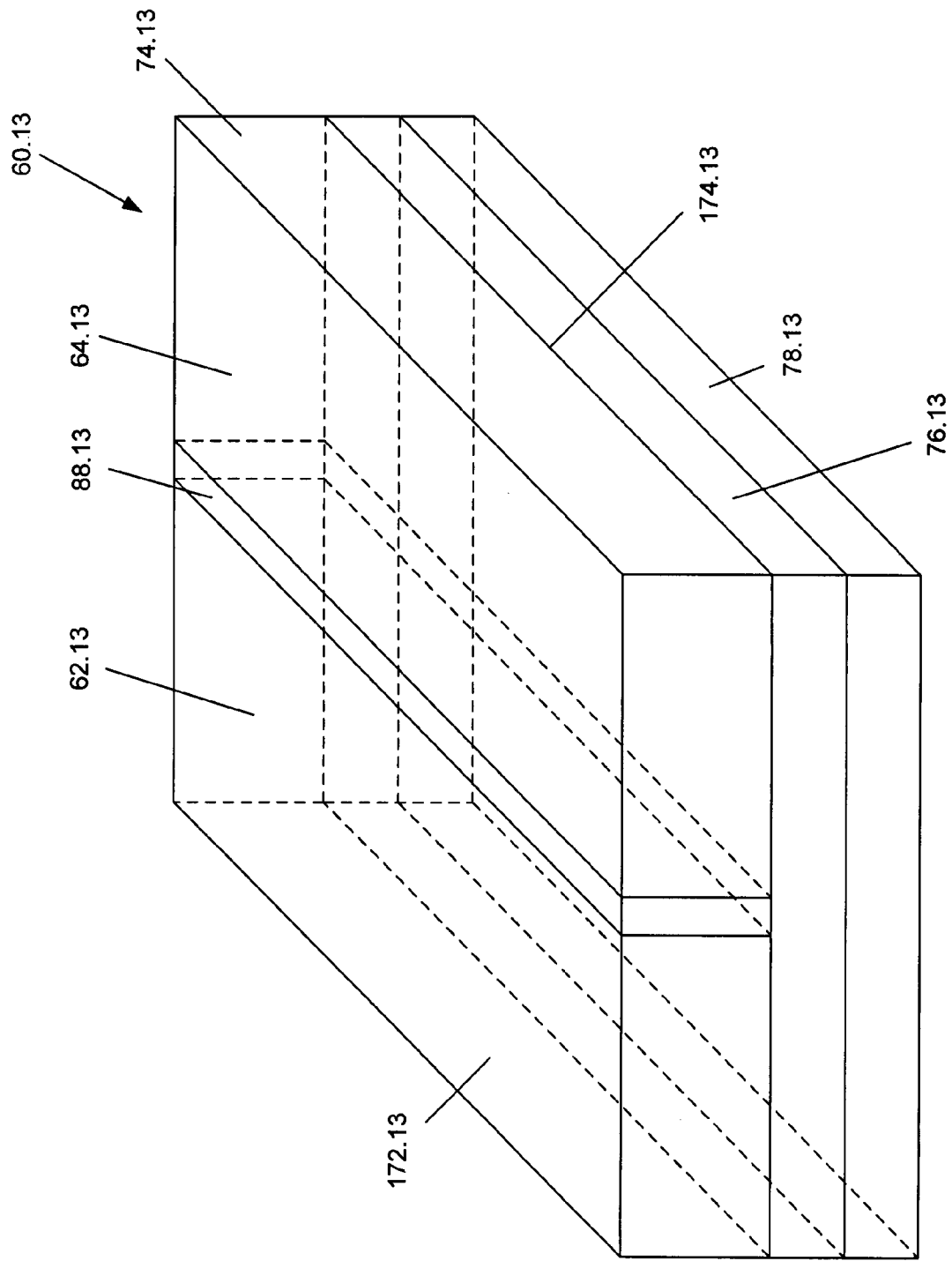
FIG. 13 is a schematic view in perspective of the light emitting and image sensing devices of the embodiments of FIGS. 4e-g.

In another embodiment of the invention illustrated in FIG. 13, wherein like parts have like reference numerals with an additional suffix, a trench 88.13 in a semiconductor substrate 74.13 separates a light emitting region 62.13 and an image sensing region 64.13. The light emitting region 62.13 and the image sensing region 64.13 correspond to the corresponding regions in the light emitting and image sensing devices 60e-g of FIGS. 4e-g respectively. Again, the trench 88.13 serves to substantially reduce light transmission from the light emitting region 62.13 through the semiconductor layer 74.13 towards the image sensing region 64.13.

Figure 14:
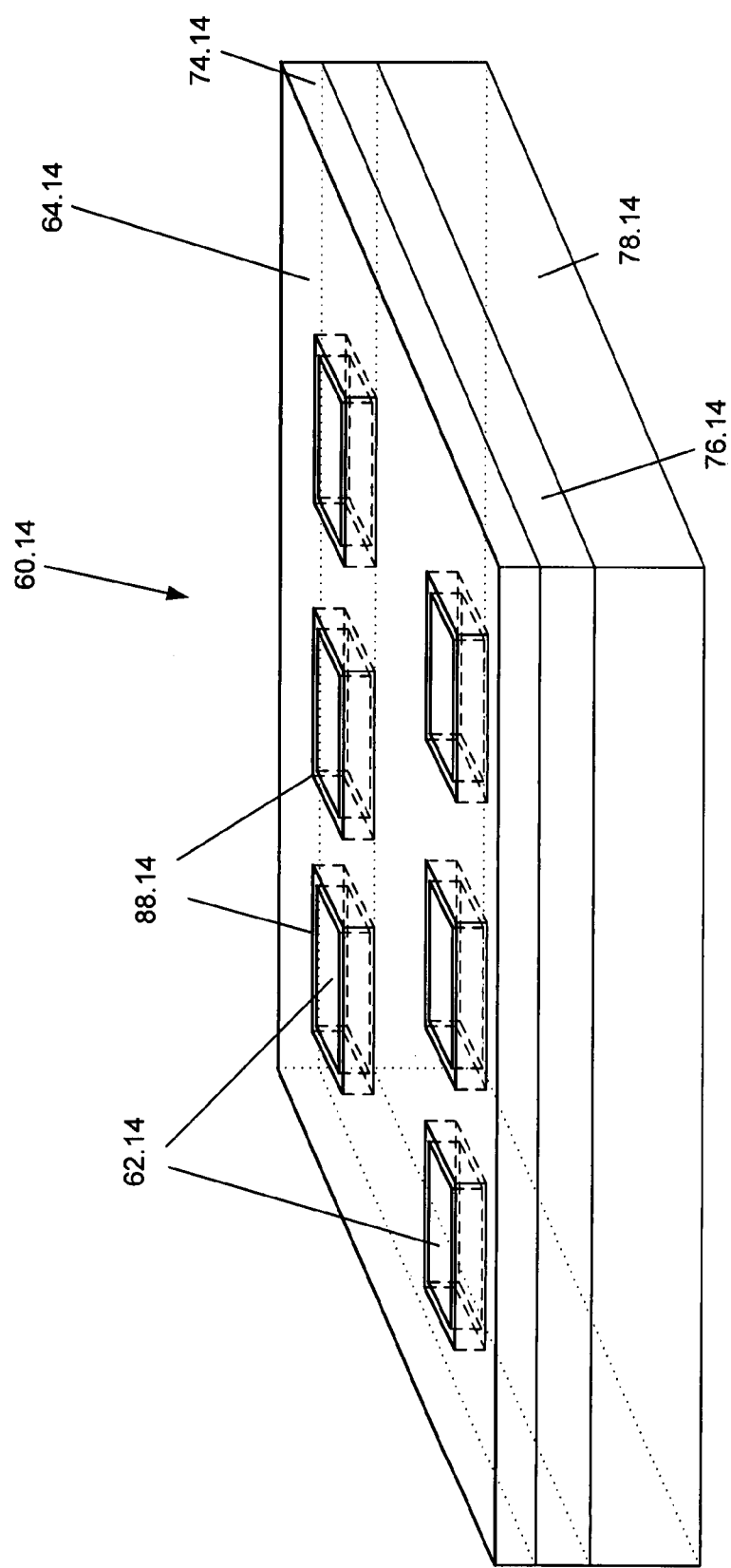
FIG. 14 is a partial schematic view in perspective of the light emitting and image sensing device of the embodiment of FIGS. 4h.

FIG. 14 illustrates another embodiment of the invention, wherein like parts have like reference numerals with an additional suffix. A plurality of trenches 88.14 in a semiconductor substrate 74.14 separate a plurality of light emitting regions 62.14 from an image sensing region 64.14. The plurality of light emitting regions 62.14 contain photoemitters corresponding to the photoemitters 68.h of the light emitting and image sensing device 60.h of FIG. 4h. The image sensing region 64.14 contains a plurality of pixel elements corresponding to the pixel elements 70.h of the light emitting and image sensing device 60h of FIG. 4h.

Figure 15:
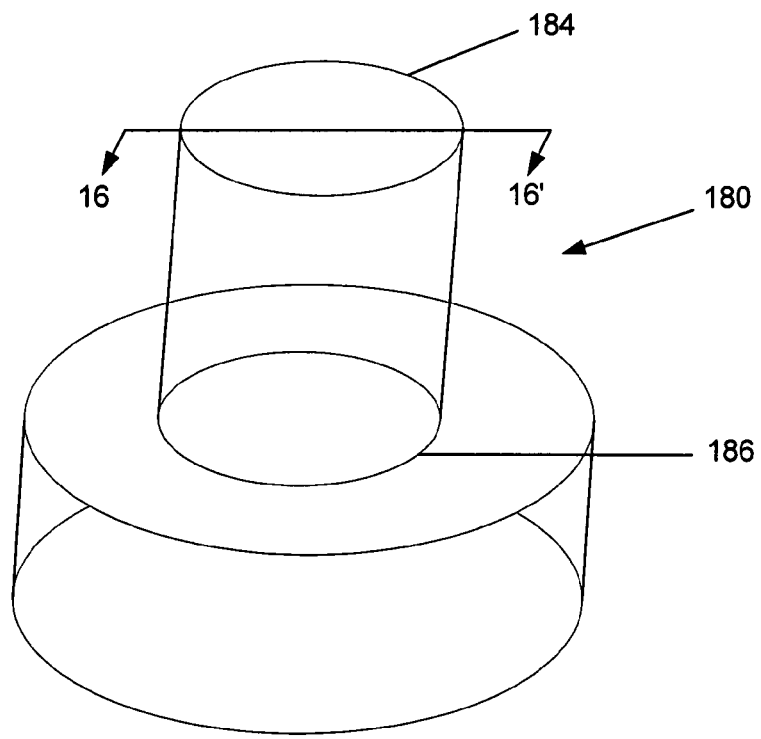
FIG. 15 is a schematic view in perspective of an embodiment of a housing for the light emitting and image sensing device of FIG. 4h.
Figure 16:
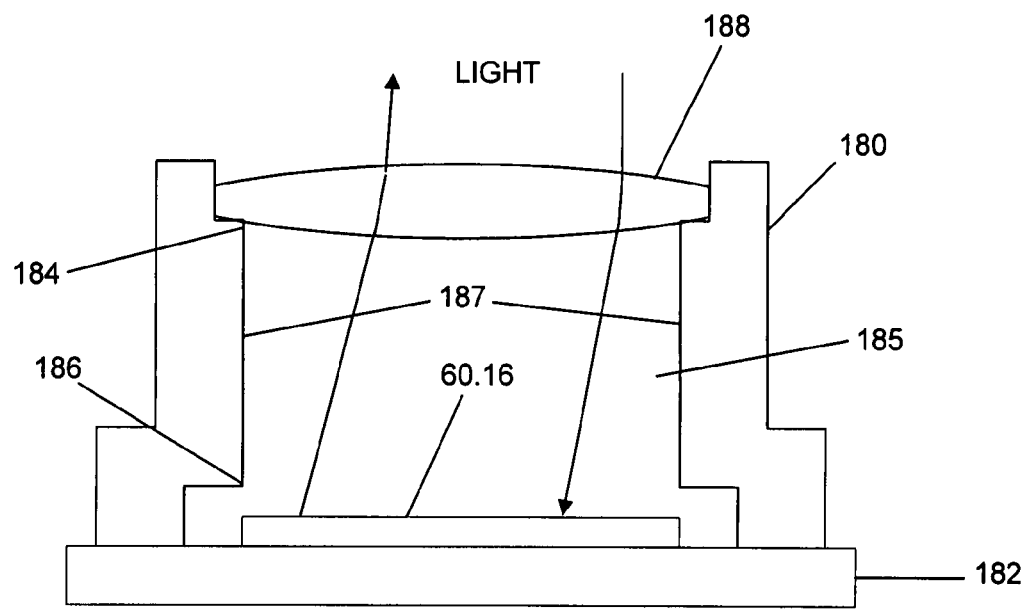
FIG. 16 is a cross-sectional schematic view of an embodiment of the invention including the housing of FIG. 15 taken along line 16-16', the light emitting and image sensing device of FIG. 4h, and a substrate.

Another embodiment of the invention is illustrated in FIGS. 15 and 16, wherein like parts have like reference numerals with an additional suffix. Referring to FIG. 16 first, a light emitting and image sensing device 60.16 is mounted on a substrate 182, for instance a printed circuit board (PCB), and a single light channel housing 180 is mounted to the substrate overtop the light emitting and image sensing device. The light emitting and image sensing device 60.16 in this embodiment can be the device 60.h illustrated in FIG. 4h.

Referring to FIGS. 15 and 16, the single channel housing 180 has a first end 184 and a second end 186 and a light channel 185. A lens 188 is attached at the first end 184. The first and second ends 184 and 186 can have different shapes, for instance circular, square or rectangular. The light channel 185 has an inner surface 187. The inner surface 187 can be shaped such that at the first end 184 it is one shape, for instance annular, and at the second end 186 it is a second shape, for instance square, with a smooth transformation of the inner surface between the ends 184 and 186.

Figure 17:
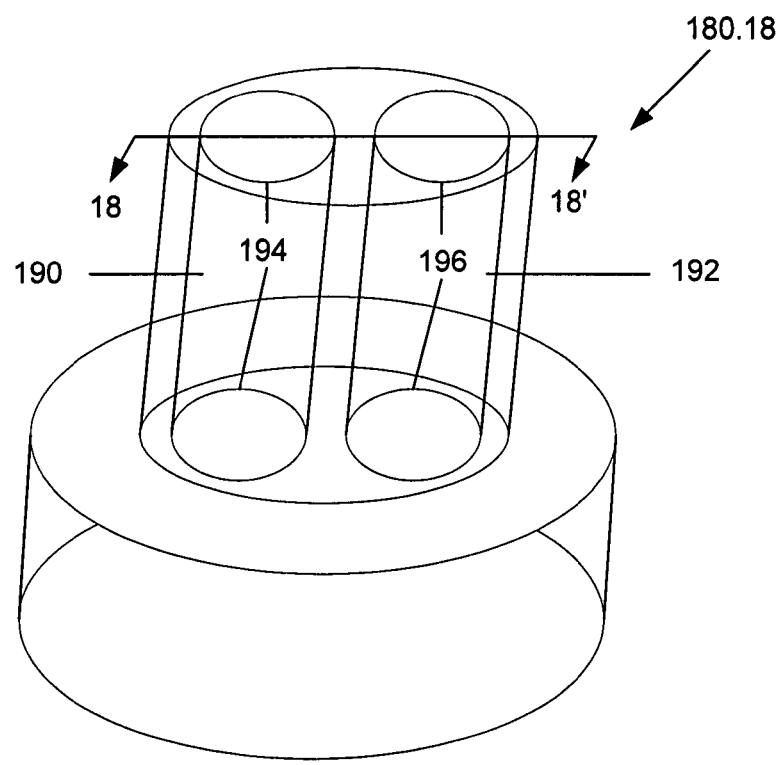
FIG. 17 is a schematic view in perspective of an embodiment of a housing having adjacent light channels.
Figure 18:
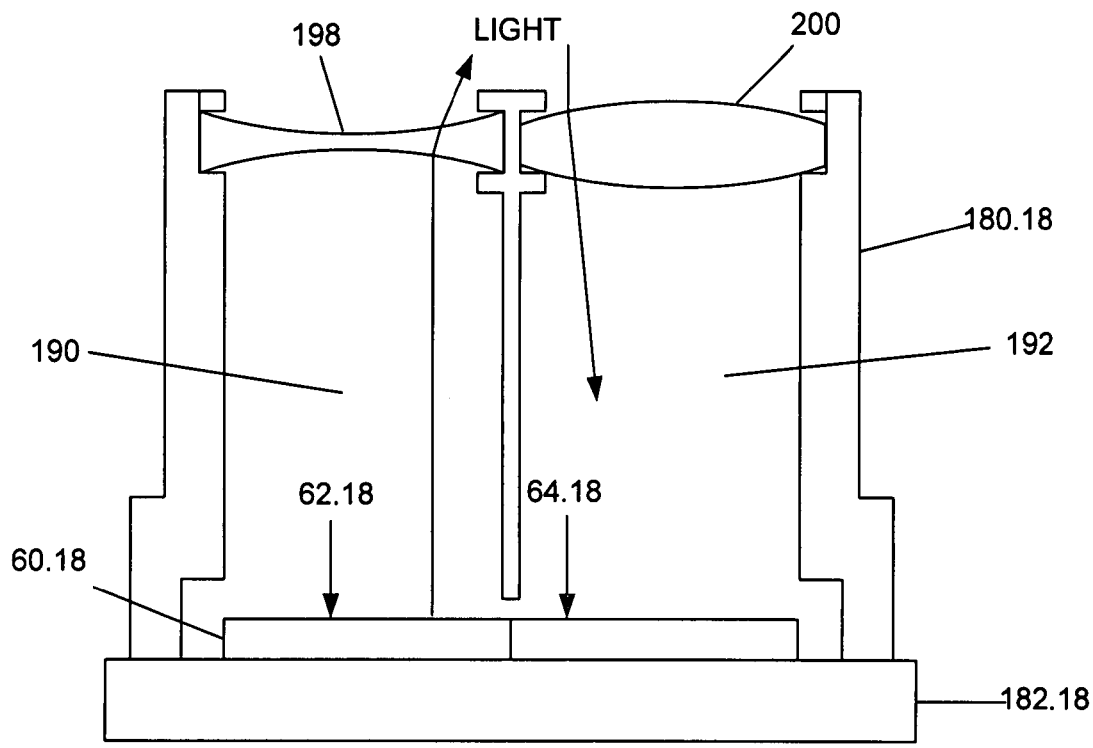
FIG. 18 is a cross-sectional schematic view of an embodiment of the invention including the housing of FIG. 17 taken along line 18-18', either one of the light emitting and image sensing devices of FIGS. 4e-g, and a substrate.

Another embodiment of the invention is illustrated in FIGS. 17 and 18, wherein like parts have like reference numerals with an additional suffix. Referring to FIG. 18 first, a light emitting and image sensing device 60.18 is mounted on a substrate 182.18, and an adjacent light channel housing 180.18 is mounted to the substrate overtop the light emitting and image sensing device. The light emitting and image sensing device 60.18 in this embodiment can be either one of the devices 60.e, 60.f and 60.g illustrated in FIGS. 4e, 4f and 4g respectively.

Referring to FIGS. 17 and 18, the adjacent light channel housing 180.18 has a first light channel 190 adjacent a second light channel 192. The first light channel 190 has opposite ends 194 and has a lens 198 attached at one end thereof. The lens 198 can be biconcave as well as other types of diverging lenses. Light from a light emitting region 62.18 of the light emitting and image sensing device 60.18 travels through lens 198 towards a scene, or an object. The lens 200 can be biconvex as well as other types of converging lenses. The opposite ends 194 can have different shapes, for instance circular, rectangular or square. The second light channel has opposite ends 196 and has a lens 200 attached at one end thereof. Light from the scene or the object travels through lens 200 towards an image sensing region 64.18 of the light emitting and image sensing device 60.18. The opposite ends 196 can have different shapes, for instance circular, rectangular or square.

Figure 19:
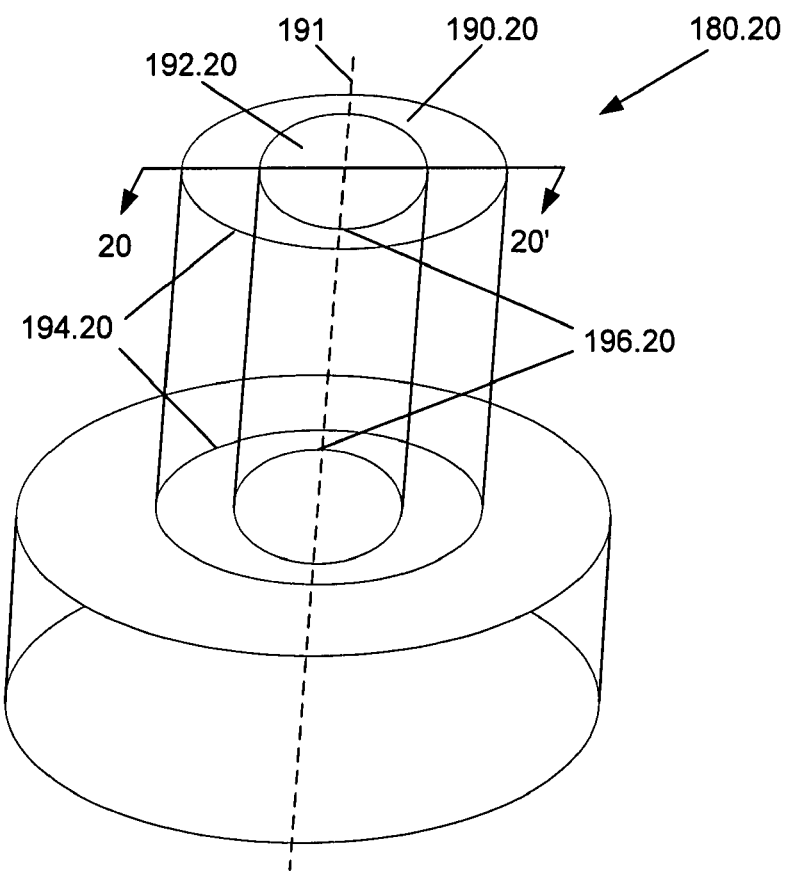
FIG. 19 is a schematic view in perspective of an embodiment of a housing having light channels with a common axis.
Figure 20:
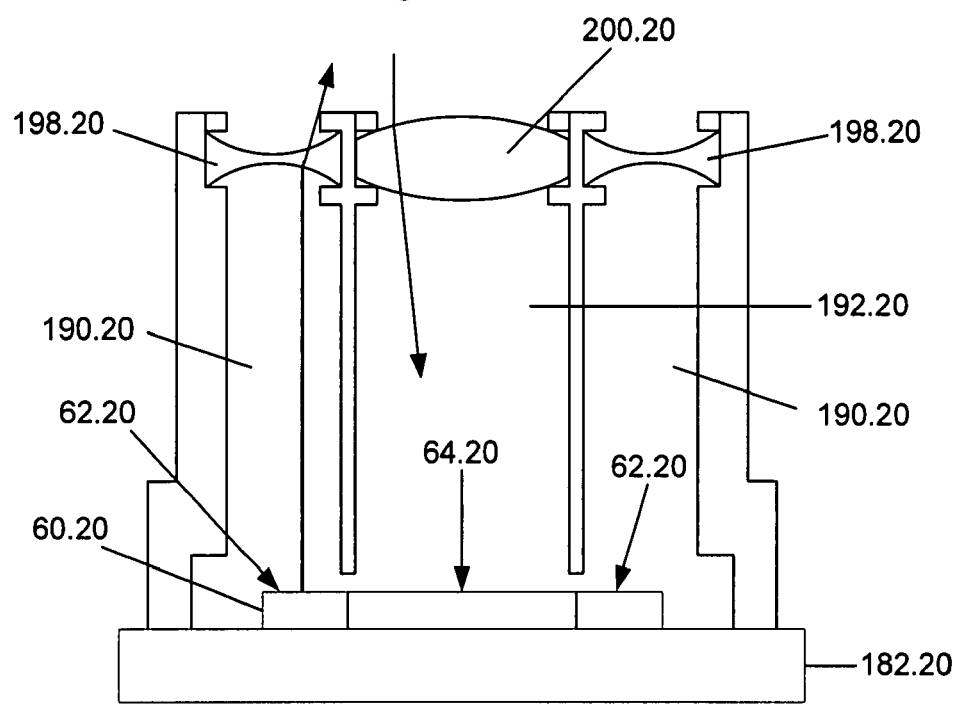
FIG. 20 is a cross-sectional schematic view of an embodiment of the invention including the housing of FIG. 19 taken along line 20-20', either one of the light emitting and image sensing devices of FIGS. 4a-d, and a substrate.

Another embodiment of the invention is illustrated in FIGS. 19 and 20, wherein like parts have like reference numerals with an additional suffix. Referring to FIG. 20 first, a light emitting and image sensing device 60.20 is mounted on a substrate 182.20, and a dual light channel housing 180.20 is mounted to the substrate overtop the light emitting and image sensing device. The light emitting and image sensing device 60.20 in this embodiment can be either of the devices 60, 60.*b* and 60.*c* of FIGS. 4*a*, 4*b* and 4*c* respectively.

Referring to FIGS. 19 and 20, the dual light channel housing 180.20 has a first light channel 190.20, having an axis 191, and a second light channel 192.20 having the same axis 191. The first light channel has opposite ends 194.20 and has a lens 198.20 attached at one end thereof. The lens 198.20 can be biconcave as well as other types of diverging lenses. Light from a light emitting region 62.20 of the light emitting and image sensing device 60.20 travels through the lens 198.20 and towards a scene, or an object. The opposite ends 194.20 can have different shapes, for instance circular, rectangular or square. The second light channel has opposite ends 196.20 and has a lens 200.20 attached at one end thereof. The lens 200.20 can be biconvex as well as other types of converging lenses. Light from the scene, or the object, travels through the lens 200.20 towards an image sensing region 64.20 of the light emitting and image sensing device 60.20. The opposite ends 196.20 can have different shapes, for instance circular, rectangular or square. Typically, the shapes of the opposite ends 194.20 of the first light channel 190.20 correspond to the shapes of the opposite ends 196.20 of the second light channel 192.20.

Figure 21:
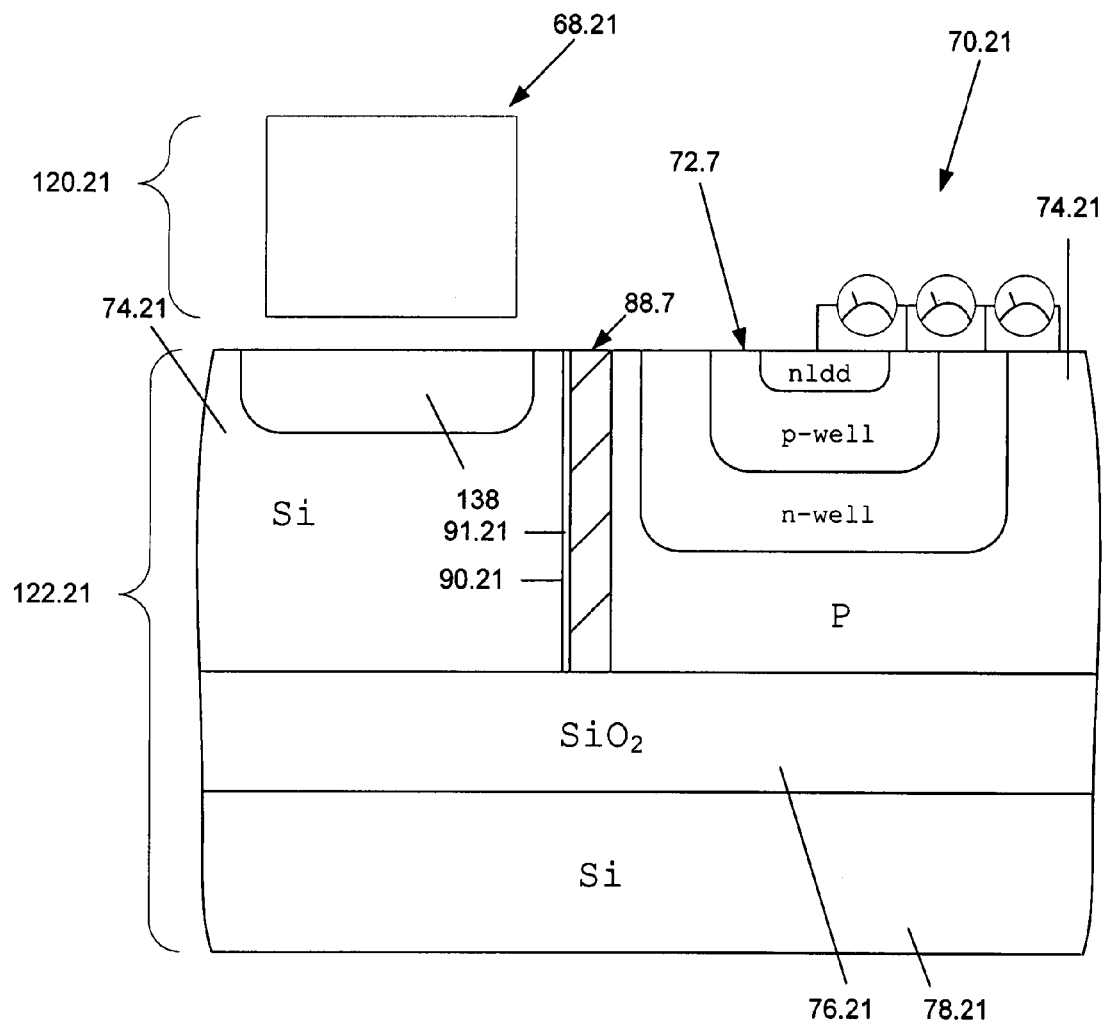
FIG. 21 is a broken-away schematic view in cross-section of a light emitting and image sensing device wherein a photoemitter is in a first semiconductor substrate and a pixel element is in a second semiconductor substrate according to another embodiment of the present invention.

Another embodiment of the invention is illustrated in FIG. 21 wherein like parts to previous embodiments have like reference numerals with an additional suffix '21'. A first semiconductor substrate 120.21 is illustrated above a second semiconductor substrate 122.21. The first semiconductor substrate 120.21 can be formed from III-V or II-VI compound semiconductor materials, or organic polymers, whereas the second semiconductor substrate 122.21 is formed from silicon. A photoemitter 68.21 is formed in the first semiconductor substrate 120.21, and a pixel element 70.21 is formed in the second semiconductor substrate 122.21. The pixel element 70.21 is similar to the pixel element 70.5 in FIG. 5. The photoemitter 68.21 can be in the form of an infrared LED, an organic LED, or an RGB LED.

Figure 22:
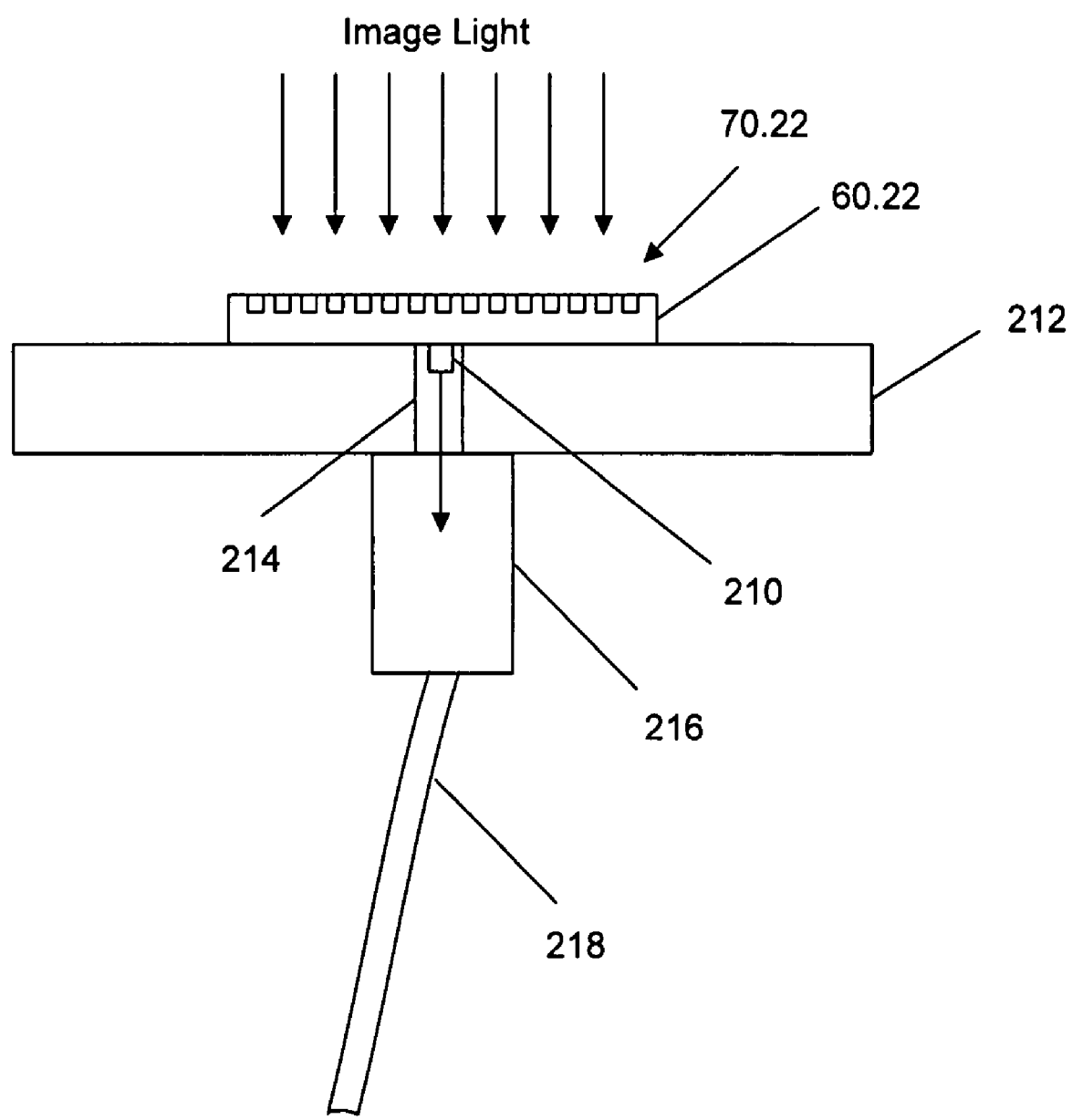
FIG. 22 is a side elevation view of a light emitting and image sensing apparatus according to another embodiment of the present invention.
Figure 23:
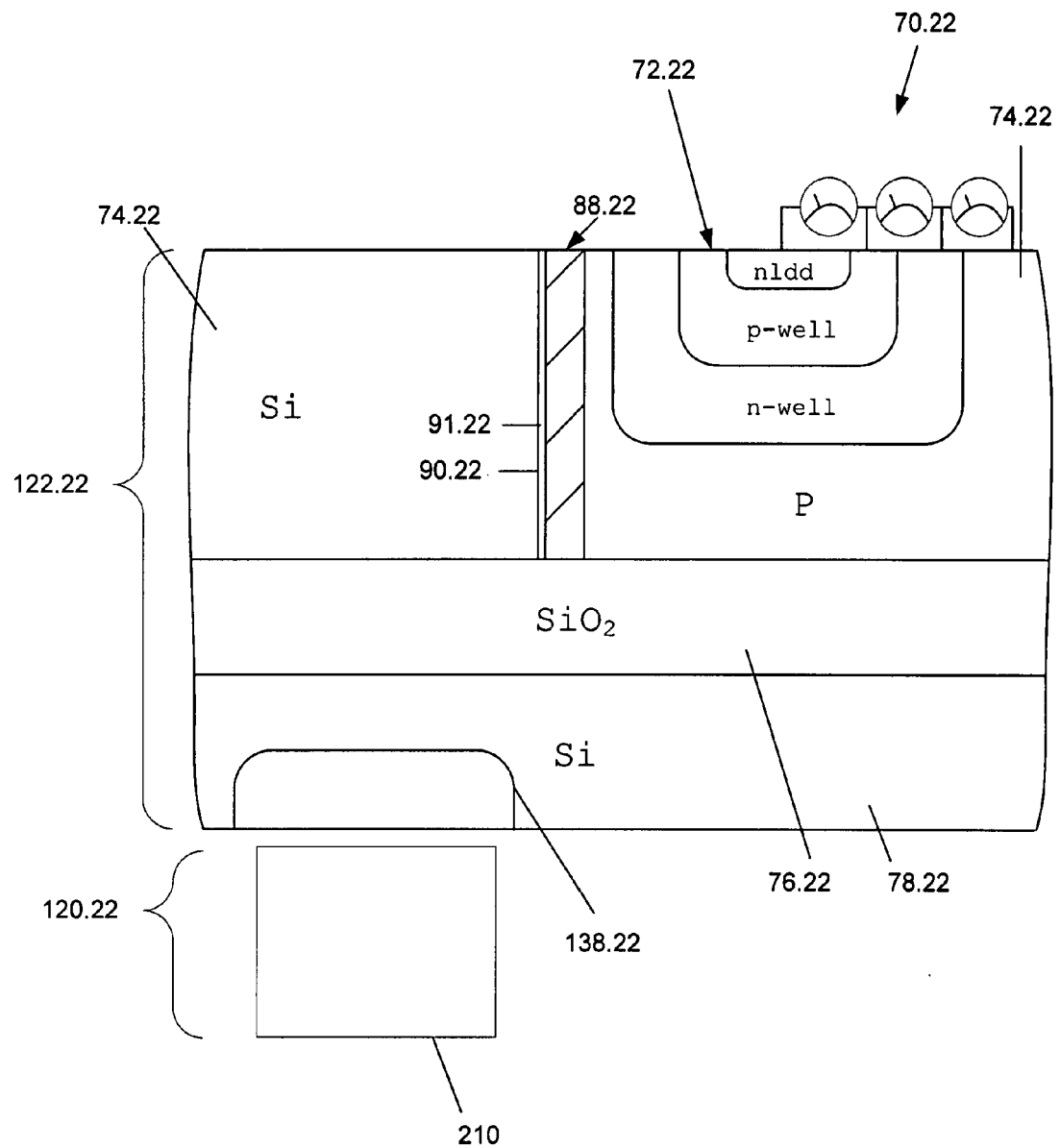
FIG. 23 is a broken-away schematic view in cross-section of a light emitting and image sensing device of the light emitting and image sensing apparatus of FIG. 22.
Figure 24:
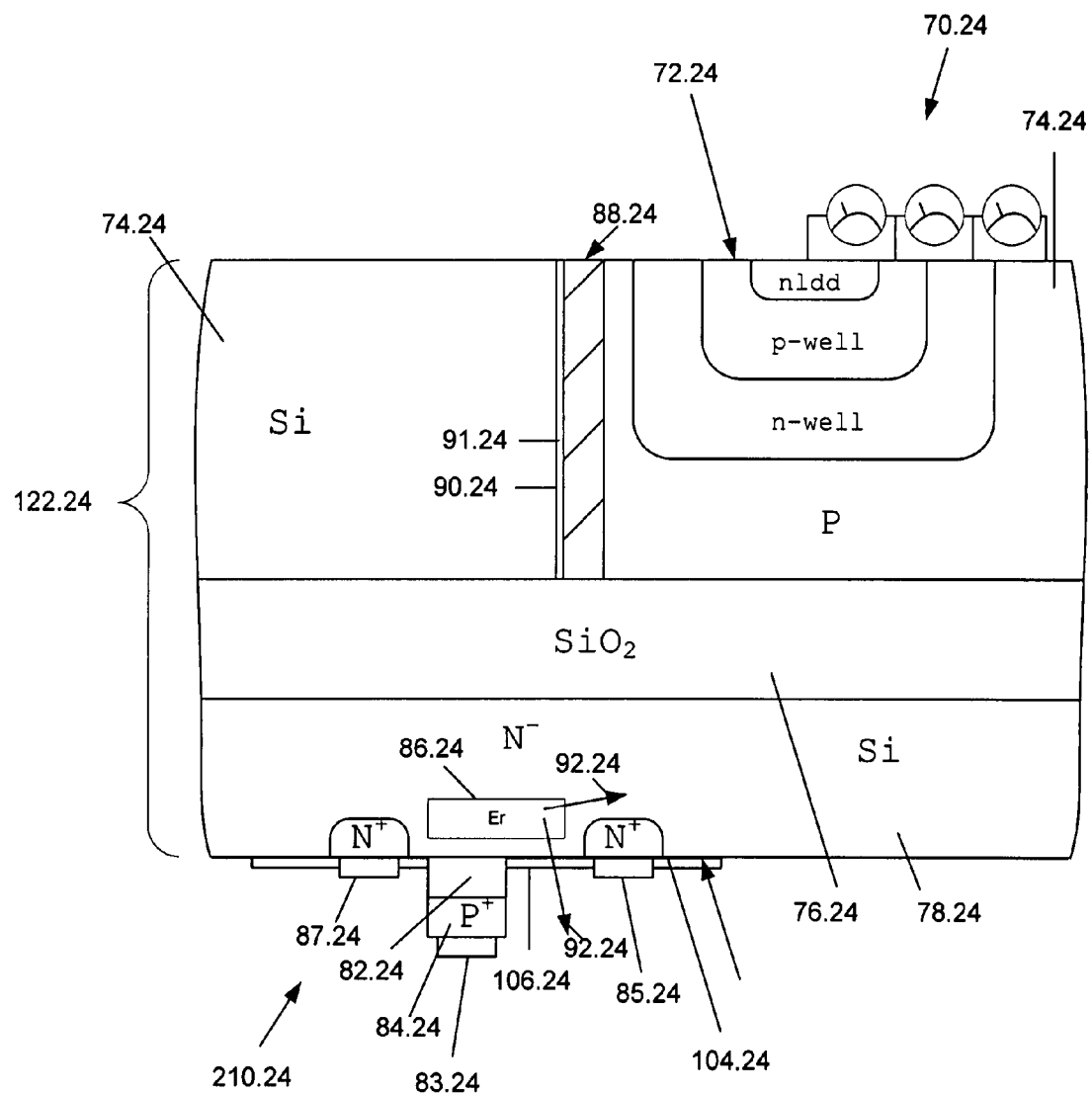
FIG. 24 is a broken-away schematic view in cross-section of the light emitting and image sensing device of FIG. 23.

Another embodiment of the present invention is illustrated in FIGS. 22, 23 and 24 wherein like parts to previous embodiments have like reference numerals with an additional suffix '22'. There is a light emitting and image sensing device 60.22 connected with a printed circuit board 212. The light emitting and image sensing device 60.22 has a plurality of pixel elements 70.22 on one side of the device 60.22. The pixel elements 70.22 transform image light into electrical signals. On the opposite side of the device 60.22 is a photoemitter 210. The photoemitter 210 is electrically coupled to the pixel elements 70.22, however other forms of coupling such as optical coupling can be used. The photoemitter 210 sequentially emits light signals representative of respective ones of the electrical signals of the pixel elements 70.22. In other embodiments, the electrical signals of the pixel elements 70.22 can be encoded into an encoded signal, which can be emitted in the form of an encoded light signal by the photoemitter 210. The photoemitter 210 transfers the electrical image captured by the device 60.22 off the device into an optical coupler 216 through a channel 214 in the printed circuit board 212. The optical coupler 216 is connected with a fiber optic cable 218 which carries the light signals generated by the photoemitter 210 to a remote desination.

Referring to FIG. 24, a more detailed description of the light emitting and image sensing device is now given. A first semiconductor substrate 122.22 is illustrated above a second semiconductor substrate 120.22. The first semiconductor substrate 122.22 is formed from silicon. The second semiconductor substrate 120.22 can be formed from III-V or II-VI compound semiconductor materials, or organic polymers. A pixel element 70.22 is formed in the first semiconductor substrate 122.22. The pixel element 70.22 is similar to the pixel element 70.5 in FIG. 5, however other pixel element structures are possible. A photoemitter 210 is formed in the second semiconductor substrate 120.22. The photoemitter 210 can be in the form of an infrared LED, an RCLED, or a VCSEL, as described previously, but other forms are possible as well. The pixel elements 70.22 can be arranged in a matrix configuration as illustrated in FIG. 9 and described previously. Each of the pixel elements 70.22 is similar to the pixel element illustrated in FIG. 10 and described previously. Note that other pixel element configurations and structures are possible, and this example is not intended to limit the invention. The photoemitter 210 can include a photoemitter controller, similar to that illustrated in FIGS. 11*a* or 11*b*, and described earlier, however other photoemitter controllers are possible. Note that in other embodiments the photoemitter 210 can be formed in a silicon layer 78.22 of the first semiconductor substrate 122.22, e.g. similar to the photoemitter in FIGS. 5 and 6.

As will be apparent to those skilled in the art, modifications can be made to the above-described invention within the scope of the appended claims.

What is claimed is:

1. A light emitting and image sensing apparatus comprising:
   a light emitting and image sensing device including:
      a photosensor means for sensing an image of the scene, the photosensor means being on a first semiconductor substrate and being responsive to incident light from the scene;
      a photoemitter means for illuminating the scene with light, the photoemitter means being on a second semiconductor substrate, the second semiconductor substrate being connected with the first semiconductor substrate; and
      a photoemitter control means for controlling an emission of light from the photoemitter means, the photoemitter control means being on the first semiconductor substrate;
   a third substrate connected with the light emitting and image sensing device;
   a means for focusing the light from the scene onto the photosensor means;
   wherein the means for focusing is connected with the light emitting and image sensing device.

2. The apparatus as claimed in claim 1, further comprising a means for directing the light from the photoemitter means to the scene, the means for directing being connected with the light emitting and image sensing device.

3. The apparatus as claimed in claim 2, wherein the means for focusing light from the scene is connected with the means for directing light to the scene.

4. The apparatus as claimed in claim 1, where the means for focusing includes a lens.

5. The apparatus as claimed in claim 2, wherein the means for directing includes a lens.

6. The apparatus as claimed in claim 2, wherein the means for directing light is located near one end of the light emitting and image sensing device, and the means for focusing is located near an end opposite the one end of the light emitting and image sensing device.

7. The apparatus as claimed in claim 2, wherein the means for directing light is located near and around the periphery of the light emitting and image sensing device, and the means for focusing is located near the center of the light emitting and image sensing device.

8. The apparatus as claimed in claim 1, wherein the means for focusing the light from the scene onto the photosensor means further functions to direct light from the photoemitter means to the scene.

9. The apparatus as claimed in claim 6, further including a first light channel from the photoemitter means of the light emitting and image sensing device to the means for directing, and a second light channel from the means for focusing to the photosensor means of the light emitting and image sensing device.

10. The apparatus as claimed in claim 7, further including a first light channel from the photoemitter means of the light emitting and image sensing device to the means for directing, and a second light channel from the means for focusing to the photosensor means of the light emitting and image sensing device.

11. A light emitting and image sensing apparatus comprising:
   a light emitting and image sensing device including:
      a photosensor means for sensing an image of the scene being on a first semiconductor substrate and being responsive to incident light from the scene, the photosensor means including:
         a plurality of select lines;
         a plurality of signal lines; and
         a plurality of pixel elements, each pixel element including:
            a photosensor structure; and
            switching means for conveying a photosensor signal between the photosensor structure and one of the plurality of signal lines, the switching means being coupled between the photosensor structure and the one of the plurality of signal lines, the switching means being responsive to select signals on one or more of the plurality of select lines for conveying the photosensor signal;
      a photoemitter means for illuminating the scene with light, the photoemitter means being on a second semiconductor substrate, said photoemitter means including a resonator, the second semiconductor substrate being connected with the first semiconductor substrate;
   a third substrate connected with the light emitting and image sensing device; and
   a means for focusing the incident light from the scene onto the photosensor means;
   wherein the means for focusing is connected with the light emitting and image sensing device.

12. The apparatus as claimed in claim 11, further comprising a means for directing the light from the photoemitter means to the scene, the means for directing being connected with the light emitting and image sensing device.

13. The apparatus as claimed in claim 12, wherein the means for focusing light from the scene is connected with the means for directing light to the scene.

14. The apparatus as claimed in claim 11, where the means for focusing includes a lens.

15. The apparatus as claimed in claim 12, wherein the means for directing includes a lens.

16. The apparatus as claimed in claim 12, wherein the means for directing light is located near one end of the light emitting and image sensing device, and the means for focusing is located near an end opposite the one end of the light emitting and image sensing device.

17. The apparatus as claimed in claim 12, wherein the means for directing light is located near and around the periphery of the light emitting and image sensing device, and the means for focusing is located near the center of the light emitting and image sensing device.

18. The apparatus as claimed in claim 11, wherein the means for focusing the light from the scene onto the photosensor means further acts to direct light from the photoemitter means to the scene.

19. The apparatus as claimed in claim 16, further including a first light channel from the photoemitter means of the light emitting and image sensing device to the means for directing, and a second light channel from the means for focusing to the photosensor means of the light emitting and image sensing device.

20. The apparatus as claimed in claim 17, further including a first light channel from the photoemitter means of the light emitting and image sensing device to the means for directing, and a second light channel from the means for focusing to the photosensor means of the light emitting and image sensing device.

* * * * *